United States Patent
Hosokawa et al.

(10) Patent No.: US 7,087,322 B2
(45) Date of Patent: Aug. 8, 2006

(54) ORGANIC ELECTROLUMINESCENCE DEVICE

(75) Inventors: Chishio Hosokawa, Sodegaura (JP); Masakazu Funahashi, Sodegaura (JP); Toshio Sakai, Sodegaura (JP); Takashi Arakane, Sodegaura (JP); Hiroshi Yamamoto, Sodegaura (JP)

(73) Assignee: Idemitsu Kosan Co., LTD, Tokyo (JP)

( * ) Notice: Subject to any disclaimer, the term of this patent is extended or adjusted under 35 U.S.C. 154(b) by 0 days.

(21) Appl. No.: 10/935,102

(22) Filed: Sep. 8, 2004

(65) Prior Publication Data

US 2005/0227111 A1    Oct. 13, 2005

Related U.S. Application Data

(63) Continuation of application No. 10/141,982, filed on May 10, 2002, now abandoned.

(30) Foreign Application Priority Data

Jun. 6, 2001    (JP) .............................. 2001-170960

(51) Int. Cl.
*H05B 33/14*    (2006.01)

(52) U.S. Cl. ...................... 428/690; 428/704; 428/917; 313/504; 313/506; 252/301.16; 252/301.26; 548/528; 534/15; 556/32

(58) Field of Classification Search ................ 428/690, 428/704, 917; 313/504, 506; 252/301.16, 252/301.26; 548/528; 534/15; 556/32
See application file for complete search history.

(56) References Cited

U.S. PATENT DOCUMENTS

| 5,536,949 A | 7/1996 | Hosokawa et al. ........... 257/40 |
| 5,635,308 A | 6/1997 | Inoue et al. ................. 428/690 |
| 5,837,166 A | 11/1998 | Kawamura et al. ......... 252/583 |
| 6,001,284 A | 12/1999 | Enokida et al. ............. 252/583 |
| 6,140,763 A | 10/2000 | Hung et al. .................. 313/503 |

FOREIGN PATENT DOCUMENTS

| JP | 08-222374 | 8/1996 |
| JP | 10-088121 | 4/1998 |
| JP | 2000-315581 | 11/2000 |
| JP | 2001-085166 | 3/2001 |
| JP | 2001-097897 | 4/2001 |

OTHER PUBLICATIONS

Hosokawa et al., "*Highly efficient blue electroluminescence from a distyrylarylene emitting layer with a new dopant*", Appl. Phys. Lett. 67 (26), Dec. 1995.

*Primary Examiner*—Ling Xu
(74) *Attorney, Agent, or Firm*—Steptoe & Johnson LLP

(57) ABSTRACT

An organic electroluminescence device comprises a cathode, an anode and a layer of an organic thin film comprising one or a plurality of layers and disposed between the cathode and the anode, wherein at least one of the layers in the layer of an organic thin film comprises a laminate of a layer comprising a metal complex having an energy gap of 2.8 eV or greater and a layer of a host material. The organic electroluminescence device exhibits a higher efficiency of light emission and has a longer life than conventional devices while the emitted light has a high luminance.

14 Claims, No Drawings

ORGANIC ELECTROLUMINESCENCE DEVICE

TECHNICAL FIELD

The present invention relates to an organic electroluminescence device and, more particularly, to an organic electroluminescence device emitting light of a high luminance at a high efficiency and having a long life.

BACKGROUND ART

An organic electroluminescence device (hereinafter, referred to as an organic EL device) is a spontaneous light emitting device which utilizes the principle that a fluorescent substance emits light by recombination of holes injected from an anode and electrons injected from a cathode when an electric field is applied.

Since an organic EL device of the laminate type driven under a low electric voltage was reported by C. W. Tang of Eastman Kodak Company (C. W. Tang and S. A. Vanslyke, Applied Physics Letters, Volume 51, Pages 913, 1987), many studies have been conducted on organic EL devices using organic materials as the constituting materials. Tang et al used tris(8-hydroxyquinolinol)aluminum as the light emitting layer and a triphenyldiamine derivative as the hole transporting layer. Advantages of the laminate structure are that the efficiency of hole injection into the light emitting layer can be increased, that the efficiency of forming excited particles which are formed by blocking and recombining electrons injected from the cathode can be increased and that excited particles formed within the light emitting layer can be enclosed. As the structure of the organic EL device, a two-layered structure having a hole transporting (injecting) layer and an electron transporting and light emitting layer and a three-layered structure having a hole transporting (injecting) layer, a light emitting layer and an electron transporting (injecting) layer are well known. To increase the efficiency of recombination of injected holes and electrons in the devices of the laminate type, the structure of the device and the process for forming the device have been studied.

As the light emitting material, chelate complexes such as tris(8-quinolinolato)aluminum, coumarine derivatives, tetraphenylbutadiene derivatives, bisstyrylarylene derivatives and oxadiazole derivatives are known. It is reported that light in the visible region ranging from blue light to red light can be obtained by using these light emitting materials and development of a device exhibiting color images is expected (For example, Japanese Patent Application Laid-Open Nos. Heisei 8(1996)-239655, Heisei 7(1995)-138561 and Heisei 3(1991)-200289).

A device using a phenylanthracene derivative as the light emitting material is disclosed in Japanese Patent Application Laid-Open No. Heisei 8(1996)-12600. The phenylanthracene derivative is used as the light emitting material emitting blue light. In general, this compound is used as the layer emitting blue light as a laminate in combination with a layer of tris(8-quinolinolato)aluminum (Alq). However, the efficiency of light emission and the life are insufficient for practical application.

In Japanese Patent Application Laid-Open No. Heisei 11(1999)-312588, a laminate having a layer of a phenylanthracene derivative and a layer of tris(8-quinolinolato)aluminum is used. However, this laminate has a problem in that the efficiency of light emission is as low as 1 to 2 cd/A. One of the causes of the problem is that the amounts of electrons and holes are not in a good balance since the injection of electrons into the layer of phenylanthracene is harder than the injection into the layer of Alq and a portion of the electric current is not used for the recombination. Another cause of the problem is that Alq is degraded by electric current when a hole current as a portion of the electric current not used for the recombination flows into the layer of Alq.

Organic EL devices emitting light of a high luminance at a high efficiency and having a long life have been reported recently. However, the performance of these devices are not always satisfactory.

DISCLOSURE OF THE INVENTION

The present invention has been made to overcome the above problems and has an object of providing an organic EL device emitting light of a higher luminance at a higher efficiency and having a longer life than those of conventional devices.

As the result of extensive studies by the present inventors to overcome the above problems, it was found that, in a device having a conventional laminate structure having a layer of a host material and a layer of Alq and, in particular, in a device having a laminate structure having a layer of a host material using a phenylanthracene derivative, which is preferable as the host material, and a layer of Alq, (1) injection of electrons from the cathode into the layer of a phenylanthracene derivative is not easy and (2) holes are injected into the layer of Alq and deterioration in the electron injecting layer takes place due to the injection of holes. Based on this knowledge, the present inventors used a layer of a metal complex having an energy gap of 2.8 eV or greater in place of the layer of Alq having an energy gap of 2.7 eV to overcome the above problems (1) and (2) and an organic EL device emitting light of a higher luminance at a higher efficiency and having a longer life than those of conventional devices has been completed.

The present invention provides an organic electroluminescence device comprising a cathode, an anode and a layer of an organic thin film comprising one or a plurality of layers and disposed between the cathode and the anode, wherein at least one of the layers in the layer of an organic thin film comprises a laminate of a layer comprising a metal complex having an energy gap of 2.8 eV or greater and a layer of a host material; and an organic electroluminescence device comprising a cathode, an anode and a layer of an organic thin film comprising one or a plurality of layers and disposed between the cathode and the anode, wherein at least one of the layers in the layer of an organic thin film comprises a mixture of a metal complex having an energy gap of 2.8 eV or greater and a host material.

The Most Preferred Embodiment to Carry Out the Invention

In the organic EL device of the present invention, it is preferable that the layer of the host material or the layer of the mixture comprises light emitting guest molecules which have an electron affinity smaller than the electron affinity of the host material and an ionization energy the same as or smaller than the ionization energy of the host material.

When the above conditions are satisfied, injection of electrons into the electron injecting layer is suppressed without adverse effects on the injection of electrons from the cathode to the layer of the host material. When conventional light emitting guest molecules such as coumarine-based compounds and dicyano compounds are used, the electron affinity of the light emitting guest molecules is greater than that of the layer of the host material. Due to this condition, the light emitting guest molecules work as a trap for electrons and the injection of electrons into the layer of the host material is suppressed. Moreover, the light emitting guest molecules cannot catch holes sufficiently. Therefore, holes tend to flow into the electron injecting layer and the deterioration of the electron injecting layer is promoted. In the present invention, the amounts of electrons and holes are kept in good balance since the electron affinity and the ionization potential satisfy the above conditions and injection of holes into the electron injecting layer can be suppressed. Therefore, the device exhibiting a higher efficiency and having a longer life than those of conventional devices can be obtained.

In the present invention, the host material is a material constituting the layer of a host material. When the light emitting guest molecules are mixed, it is preferable that the host material has an energy gap greater than that of the light emitting guest molecules. One of the following cases (1) and (2) is more preferable.

(1) From the standpoint of enhancing the property of the light emitting host molecules to catch holes when the light emitting guest molecules are mixed, it is preferable that the host material has an energy gap of 2.8 eV or greater. The reason is that, when the energy gap is great, the ionization energy of the host material is increased and the host material can work more effectively as the hole trap even when the same light emitting guest molecules are used. In particular, this case is preferable for obtaining emission of blue light.

(2) From the standpoint of improving the balance between the amounts of electrons and holes in the construction having the layer of the host material and the layer of a metal complex, it is preferable that the layer of the host material has the hole transporting property. The hole transporting property is defined as the charge transporting property when the mobility of holes is greater than the mobility of electrons and can be measured in accordance with a conventional method such as the method of time of flight.

It is preferable that the host material is at least one compound selected from distyrylarylene derivatives, diarylanthracene derivatives and diarylbisanthracene derivatives.

As the distyrylarylene derivative, light emitting compounds represented by the following general formula (1) is preferable.

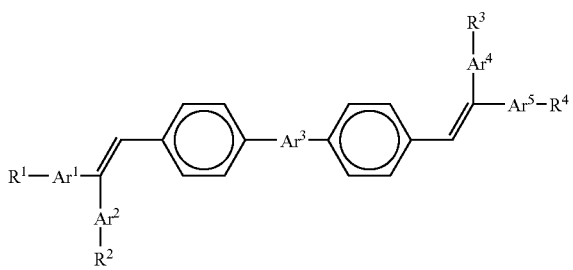

(1)

In the above general formula (1), $Ar^1$, $Ar^2$, $Ar^3$, $Ar^4$ and $Ar^5$ each independently represent a substituted or unsubstituted phenylene group, a substituted or unsubstituted naphthalene group, a substituted or unsubstituted anthracene group, a substituted or unsubstituted diphenylanthracene group, a substituted or unsubstituted phenanthrene group, a substituted or unsubstituted acenaphthene group, a substituted or unsubstituted biphenylene group, a substituted or unsubstituted fluorene group, a substituted or unsubstituted carbazole group, a substituted or unsubstituted thiophene group, a substituted or unsubstituted triazole group or a substituted or unsubstituted thiadiazole group. $R^1$, $R^2$, $R^3$ and $R^4$ each independently represent hydrogen atom, an alkyl group having 1 to 30 carbon atoms, an alkoxyl group having 1 to 30 carbon atoms, an aryl group having 1 to 30 carbon atoms, a trialkylsilyl group having 1 to 30 carbon atoms or cyano group.

As the diarylanthracene derivative, arylbisanthracene derivatives represented by the following general formula (2) are preferable.

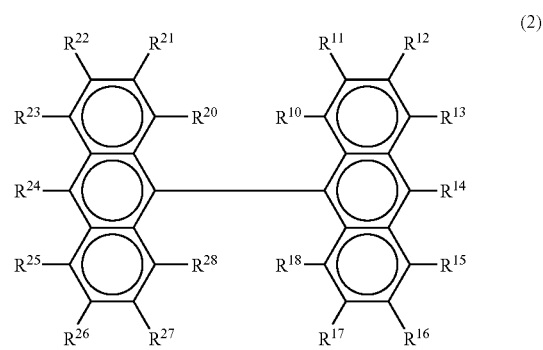

(2)

In the above general formula (2), $R^{10}$ to $R^{13}$, $R^{15}$ to $R^{18}$, $R^{20}$ to $R^{23}$ and $R^{25}$ to $R^{28}$ each independently represent hydrogen atom, a halogen atom, hydroxyl group, a substituted or unsubstituted amino group, nitro group, cyano group, a substituted or unsubstituted alkyl group having 1 to 30 carbon atoms, a substituted or unsubstituted alkenyl group having 2 to 30 carbon atoms, a substituted or unsubstituted cycloalkyl group having 5 to 30 carbon atoms, a substituted or unsubstituted alkoxyl group having 1 to 30 carbon atoms, a substituted or unsubstituted aromatic hydrocarbon group having 6 to 40 carbon atoms, a substituted or unsubstituted aromatic heterocyclic group having 2 to 40 carbon atoms, a substituted or unsubstituted aralkyl group having 7 to 40 carbon atoms, a substituted or unsubstituted aryloxyl group having 6 to 40 carbon atoms, a substituted or unsubstituted alkoxycarbonyl group having 2 to 30 carbon atoms or carboxyl group and $R^{14}$ and $R^{24}$ each independently represent a substituted or unsubstituted aryl group having 6 to 40 carbon atoms.

Among the above compounds, arylanthracene derivatives expressed by formulae (1') to (5') and distyrylarylene derivatives expressed by formulae (6') to (9') are more preferable as the host material.

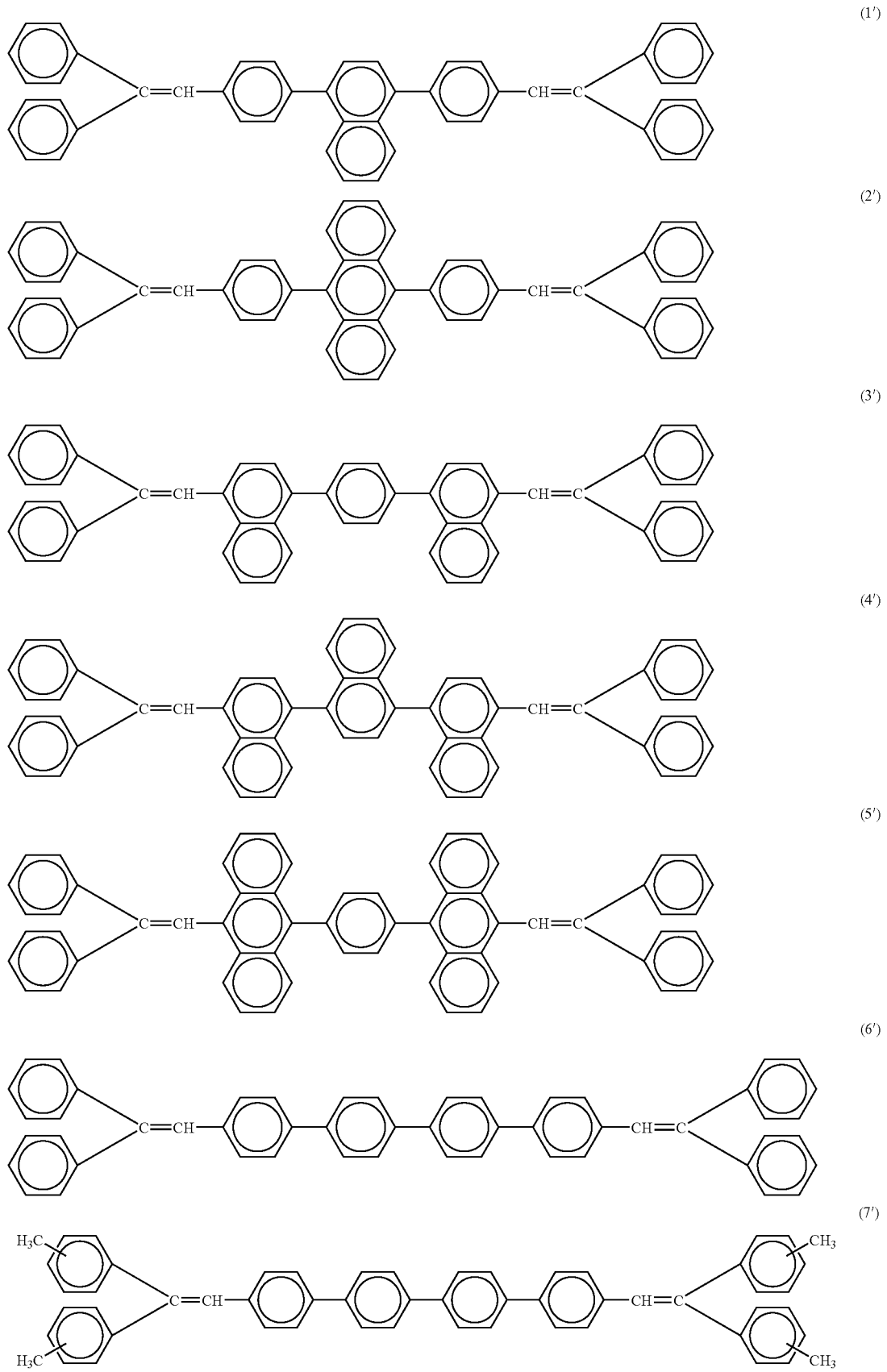

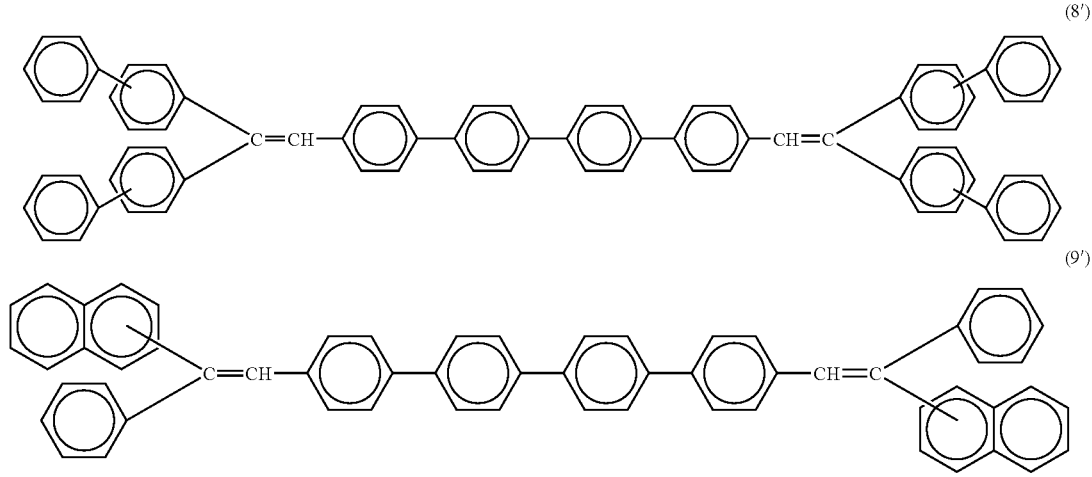

The groups in the above general formula (2) will be described specifically in the following.

The amino group is represented by —NX$^1$X$^2$. X$^1$ and X$^2$ each independently represent hydrogen atom, methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, 1,2,3-trinitropropyl group, phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 4-styrylphenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylpheny group, p-(2-phenylpropyl)phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group, 2-pyrrolyl group, 3-pyrrolyl group, pyradinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxanyl group, 5-quinoxanyl group, 6-quinoxanyl group, 1-carbazolyl group, 2-carbazolyl group, 3-carbazolyl group, 4-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthrolin-2-yl group, 1,7-phenanthrolin-3-yl group, 1,7-phenanthrolin-4-yl group, 1,7-phenanthrolin-5-yl group, 1,7-phenanthrolin-6-yl group, 1,7-phenanthrolin-8-yl group, 1,7-phenanthrolin-9-yl group, 1,7-phenanthrolin-10-yl group, 1,8-phenanthrolin-2-yl group, 1,8-phenanthrolin-3-yl group, 1,8-phenanthrolin-4-yl group, 1,8-phenanthrolin-5-yl group, 1,8-phenanthrolin-6-yl group, 1,8-phenanthrolin-7-yl group, 1,8-phenanthrolin-9-yl group, 1,8-phenanthrolin-10-yl group, 1,9-phenanthrolin-2-yl group, 1,9-phenanthrolin-3-yl group, 1,9-phenanthrolin-4-yl group, 1,9-phenanthrolin-5-yl group, 1,9-phenanthrolin-6-yl group, 1,9-phenanthrolin-7-yl group, 1,9-phenanthrolin-8-yl group, 1,9-phenanthrolin-10-yl group, 1,10-phenanthrolin-2-yl group, 1,10-phenanthrolin-3-yl group, 1,10-phenanthrolin-4-yl group, 1,10-phenanthrolin-5-yl group, 2,9-phenanthrolin-1-yl group, 2,9-phenanthrolin-3-yl group, 2,9-phenanthrolin-4-yl group, 2,9-phenanthrolin-5-yl group, 2,9-phenanthrolin-6-yl group, 2,9-phenanthrolin-7-yl group, 2,9-phenanthrolin-8-yl group, 2,9-phenanthrolin-10-yl group, 2,8-phenanthrolin-1-yl group, 2,8-phenanthrolin-3-yl group, 2,8-phenanthrolin-4-yl group, 2,8-phenanthrolin-5-yl group, 2,8-phenanthrolin-6-yl group, 2,8-phenanthrolin-7-yl group, 2,8-phenanthrolin-9-yl group, 2,8-phenanthrolin-10-yl group, 2,7-phenanthrolin-1-yl group, 2,7-phenanthrolin-3-yl group, 2,7-phenanthrolin-4-yl group, 2,7-phenanthrolin-5-yl group, 2,7-phenanthrolin-6-yl group, 2,7-phenanthrolin-8-yl group, 2,7-phenanthrolin-9-yl group, 2,7-phenanthrolin-10-yl group, 1-phenazinyl group, 2-phenazinyl group, 1-phenothiazinyl group, 2-phenothiazinyl group, 3-phenothiazinyl group, 4-phenothiazinyl group, 1-phenoxazinyl group, 2-phenoxazinyl group, 3-phenoxazinyl group, 4-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrol-1-yl group, 2-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group or 4-t-butyl-3-indolyl group.

Examples of the alkyl group include methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group and 1,2,3-trinitropropyl group.

Examples of the alkenyl group include vinyl group, allyl group, 1-butenyl group, 2-butenyl group, 3-butenyl group, 1,3-butadienyl group, 1-methylvinyl group, styryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl-1-butenyl group and 3-phenyl-1-butenyl group.

Examples of the cycloalkyl group include cyclopropyl group, cyclobutyl group, cyclopentyl group, cyclohexyl group and 4-methylcyclohexyl group.

The alkoxyl group is represented by —OY. Examples of the group represented by Y include methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxy-isopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group and 1,2,3-trinitropropyl group.

Examples of the aromatic hydrocarbon group include phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylpheny group, p-(2-phenylpropyl)phenyl group, 3-methyl-2-naphthyl group, 4-methyl-1-naphthyl group, 4-methyl-1-anthryl group, 4'-methylbiphenylyl group and 4"-t-butyl-p-terphenyl-4-yl group.

Examples of the aromatic heterocyclic group include 1-pyrrolyl group, 2-pyrrolyl group, 3-pyrrolyl group, pyradinyl group, 2-pyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxanyl group, 5-quinoxanyl group, 6-quinoxanyl group, 1-carbazolyl group, 2-carbazolyl group, 3-carbazolyl group, 4-carbazolyl group, 9-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthrolin-2-yl group, 1,7-phenanthrolin-3-yl group, 1,7-phenanthrolin-4-yl group, 1,7-phenanthrolin-5-yl group, 1,7-phenanthrolin-6-yl group, 1,7-phenanthrolin-8-yl group, 1,7-phenanthrolin-9-yl group, 1,7-phenanthrolin-10-yl group, 1,8-phenanthrolin-2-yl group, 1,8-phenanthrolin-3-yl group, 1,8-phenanthrolin-4-yl group, 1,8-phenanthrolin-5-yl group, 1,8-phenanthrolin-6-yl group, 1,8-phenanthrolin-7-yl group, 1,8-phenanthrolin-9-yl group, 1,8-phenanthrolin-10-yl group, 1,9-phenanthrolin-2-yl group, 1,9-phenanthrolin-3-yl group, 1,9-phenanthrolin-4-yl group, 1,9-phenanthrolin-5-yl group, 1,9-phenanthrolin-6-yl group, 1,9-phenanthrolin-7-yl group, 1,9-phenanthrolin-8-yl group, 1,9-phenanthrolin-10-yl group, 1,10-phenanthrolin-2-yl group, 1,10-phenanthrolin-3-yl group, 1,10-phenanthrolin-4-yl group, 1,10-phenanthrolin-5-yl group, 2,9-phenanthrolin-1-yl group, 2,9-phenanthrolin-3-yl group, 2,9-phenanthrolin-4-yl group, 2,9-phenanthrolin-5-yl group, 2,9-phenanthrolin-6-yl group, 2,9-phenanthrolin-7-yl group, 2,9-phenanthrolin-8-yl group, 2,9-phenanthrolin-10-yl group, 2,8-phenanthrolin-1-yl group, 2,8-phenanthrolin-3-yl group, 2,8-phenanthrolin-4-yl group, 2,8-phenanthrolin-5-yl group, 2,8-phenanthrolin-6-yl group, 2,8-phenanthrolin-7-yl group, 2,8-phenanthrolin-9-yl group, 2,8-phenanthrolin-10-yl group, 2,7-phenanthrolin-1-yl group, 2,7-phenanthrolin-3-yl group, 2,7-phenanthrolin-4-yl group, 2,7-phenanthrolin-5-yl group, 2,7-phenanthrolin-6-yl group, 2,7-phenanthrolin-8-yl group, 2,7-phenanthrolin-9-yl group, 2,7-phenanthrolin-10-yl group, 1-phenazinyl group, 2-phenazinyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrol-1-yl group, 2-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group and 4-t-butyl-3-indolyl group.

Examples of the aralkyl group include benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, 2-β-naphthylisopropyl group, 1-pyrrolylmethyl group, 2-(1-pyrrolyl)ethyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group and 1-chloro-2-phenylisopropyl group.

The aryloxyl group is represented by —OZ. Examples of the group represented by Z include phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylpheny group, p-(2-phenylpropyl)phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group, 2-pyrrolyl group, 3-pyrrolyl group, pyradinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxanyl group, 5-quinoxanyl group, 6-quinoxanyl group, 1-carbazolyl group, 2-carbazolyl group, 3-carbazolyl group, 4-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthrolin-2-yl group, 1,7-phenanthrolin-3-yl group, 1,7-phenanthrolin-4-yl group, 1,7-phenanthrolin-5-yl group, 1,7-phenanthrolin-6-yl group, 1,7-phenanthrolin-8-yl group, 1,7-phenanthrolin-9-yl group, 1,7-phenanthrolin-10-yl group, 1,8-phenanthrolin-2-yl group, 1,8-phenanthrolin-3-yl group, 1,8-phenanthrolin-4-yl group, 1,8-phenanthrolin-5-yl group, 1,8-phenanthrolin-6-yl group, 1,8-phenanthrolin-7-yl group, 1,8-phenanthrolin-9-yl group, 1,8-phenanthrolin-10-yl group, 1,9-phenanthrolin-2-yl group, 1,9-phenanthrolin-3-yl group, 1,9-phenanthrolin-4-yl group, 1,9-phenanthrolin-5-yl group, 1,9-phenanthrolin-6-yl group, 1,9-phenanthrolin-7-yl group, 1,9-phenanthrolin-8-yl group, 1,9-phenanthrolin-10-yl group, 1,10-phenanthrolin-2-yl group, 1,10-phenanthrolin-3-yl group, 1,10-phenanthrolin-4-yl group, 1,10-phenanthrolin-5-yl group, 2,9-phenanthrolin-1-yl group, 2,9-phenanthrolin-3-yl group, 2,9-phenanthrolin-4-yl group, 2,9-phenanthrolin-5-yl group, 2,9-phenanthrolin-6-yl group, 2,9-phenanthrolin-7-yl group, 2,9-phenanthrolin-8-yl group, 2,9-phenanthrolin-10-yl group, 2,8-phenanthrolin-1-yl group, 2,8-phenanthrolin-3-yl group, 2,8-phenanthrolin-4-yl group, 2,8-phenanthrolin-5-yl group, 2,8-phenanthrolin-6-yl group, 2,8-phenanthrolin-7-yl group, 2,8-phenanthrolin-9-yl group, 2,8-phenanthrolin-10-yl group, 2,7-phenanthrolin-1-yl group, 2,7-phenanthrolin-3-yl group, 2,7-phenanthrolin-4-yl group, 2,7-phenanthrolin-5-yl group, 2,7-phenanthrolin-6-yl group, 2,7-phenanthrolin-8-yl group, 2,7-phenanthrolin-9-yl group, 2,7-phenanthrolin-10-yl group, 1-phenazinyl group, 2-phenazinyl group, 1-phenothiazinyl group, 2-phenothiazinyl group, 3-phenothiazinyl group, 4-phenothiazinyl group, 1-phenoxazinyl group, 2-phenoxazinyl group, 3-phenoxazinyl group, 4-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrol-1-yl group, 2-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group and 4-t-butyl-3-indolyl group.

The alkoxycarbonyl group is represented by —COOY. Examples of the group represented by Y include methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxy-isopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group and 1,2,3-trinitropropyl group.

Examples of the divalent group forming the ring include tetramethylene group, pentamethylene group, hexamethylene group, diphenylmethane-2,2'-diyl group, diphenylethane-3,3'-diyl group and diphenylpropane-4,4'-diyl group.

Examples of the aryl group include phenyl group, naphthyl group, anthryl group, phenanthryl group, naphthaceyl group and pyrenyl group. Examples of the substituent to the aryl group include halogen atoms, hydroxyl group, substituted or unsubstituted amino groups described above, nitro group, cyano group, substituted or unsubstituted alkyl groups described above, substituted or unsubstituted alkenyl groups described above, substituted or unsubstituted cycloalkyl groups described above, substituted or unsubstituted alkoxyl groups described above, substituted or unsubstituted aromatic hydrocarbon groups described above, substituted or unsubstituted aromatic heterocyclic groups described above, substituted or unsubstituted aralkyl groups described above, substituted or unsubstituted aryloxyl groups described above, substituted or unsubstituted alkoxycarbonyl groups described above and carboxyl group.

In the present invention, the light emitting guest molecule has an electron affinity smaller than that of the host material and an ionization potential the same as or smaller than that of the host material. As the light emitting guest molecule, amine compounds having styryl group and condensed aromatic amine compounds are preferable and the amine compounds having styryl group are more preferable. Examples of the amine compounds having styryl group include compounds represented by the following general formulae (8) and (9):

(8)

In the above general formula (8), $Ar^{5\prime}$ represents a divalent group selected from phenylene group, biphenylene group, terphenylene group and stylbene group, $Ar^{6\prime}$ and $Ar^{7\prime}$ each independently represent hydrogen atom or an aromatic group having 6 to 20 carbon atoms, the groups represented by $Ar^{5\prime}$, $Ar^{6\prime}$ and $Ar^{7\prime}$ may be substituted and m' represents a number of condensation which is an integer of 1 to 4.

In general formula (8), it is preferable that at least one of the groups represented by $Ar^{6\prime}$ and $Ar^{7\prime}$ is substituted with styryl group. Examples of the aromatic group having 6 to 20 carbon atoms include phenyl group, naphthyl group, anthranyl group, phenanthryl group and terphenyl group.

(9)

In the above general formula (9), $Ar^{8\prime}$ represents an aromatic group having 6 to 40 carbon atoms, $Ar^{9\prime}$ and $Ar^{10\prime}$ represents hydrogen atom or an aromatic group having 6 to 20 carbon atoms, the groups represented by $Ar^{8\prime}$, $Ar^{9\prime}$ and $Ar^{10\prime}$ may be substituted with proviso that at least one of the groups represented by $Ar^{8\prime}$, $Ar^{9\prime}$ and $Ar^{10\prime}$ is substituted with an alkylamino group and n' represents an integer of 1 to 4.

Examples of the aromatic group having 6 to 40 carbon atoms in general formula (9) include aryl groups such as phenyl group, naphthyl group, anthranyl group, phenanthryl group, pyrenyl group, coronyl group, biphenyl group, terphenyl group, pyrrolyl group, furanyl group, thiophenyl group, benzothiophenyl group, oxadiazolyl group, diphenylanthranyl group, indolyl group, carbazolyl group, pyridyl group, benzoquinolyl group, fluoranthenyl group and acenaphthofluoranthenyl group; and arylene groups such as phenylene group, naphthylene group, anthranylene group, phenanthrylene group, pyrenylene group, coronylene group, biphenylene group, terphenylene group, pyrrolylene group, furanylene group, thiophenylene group, benzothiophenylene group, oxadiazolyene group, diphenylanthranylene group, indolylene group, carbazolylene group, pyridylene group, benzoquinolylene group, fluroranthenylene group and acenaphthofluoranthenylene group. The aromatic group having 6 to 40 carbon atoms may further be substituted with a substituent. Examples of the substituent include alkyl groups having 1 to 6 carbon atoms such as ethyl group, methyl group, isopropyl group, n-propyl group, s-butyl group, t-butyl group, pentyl group, hexyl group, cyclopentyl group and cyclohexyl group; alkoxyl groups having 1 to 6 carbon atoms such as ethoxyl group, methoxyl group, isopropoxyl group, n-propoxyl group, s-butoxyl group, t-butoxyl group, pentoxyl group, hexyloxyl group, cyclopentoxyl group and cyclohexyloxyl group; aryl groups having 5 to 40 carbon atoms in the nucleus; amino group substituted with the aryl group having 5 to 40 carbon atoms in the nucleus; ester groups having the aryl group having 5 to 40 carbon atoms in the nucleus; ester groups having the alkyl group having 1 to 6 carbon atoms; cyano group, nitro group and halogen atoms.

In the present invention, the metal complex comprised in the layer of an organic thin film has an energy gap of 2.8 eV or greater and is preferably a metal complex having a ring having nitrogen as the ligand.

It is preferable that the metal complex is a complex represented by general formula (3) or general formula (5).

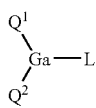

(3)

In the above general formula (3), $Q^1$ and $Q^2$ each independently represent a ligand represented by general formula (4), L represents a substituted or unsubstituted alkyl group having 1 to 30 carbon atoms, a substituted or unsubstituted cycloalkyl group having 5 to 30 carbon atoms, a substituted or unsubstituted aryl group having 6 to 40 carbon atoms, a substituted or unsubstituted heterocyclic group having 2 to 40 carbon atoms or a ligand represented by —OR, —OAr, —ORAr, —OC(O)R, —OC(O)Ar, —OP(O)R$_2$, —SeAr, —TeAr, —SAr, —X, —OP(O)Ar$_2$, —OS(O$_2$)R, —OS(O$_2$)Ar, —OSiR$_3$, —OB(OR)$_2$, —OSiAr$_3$, —OArO—, —OC(O)ArC(O)O— (in the formulae, R representing a substituted or unsubstituted alkyl group having 1 to 30 carbon atoms or a substituted or unsubstituted cycloalkyl group having 5 to 30 carbon atoms, X representing a halogen atom, and Ar representing a substituted or unsubstituted aryl compound having 6 to 36 carbon atoms or a substituted or unsubstituted heterocyclic group having 5 to 40 carbon atoms) or —O—Ga-Q$^3$(Q$^4$) (in the formula, $Q^3$ and $Q^4$ each independently representing a same ligand as that represented by $Q^1$ or $Q^2$).

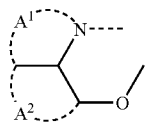

(4)

In the above general formula (4), $A^1$ and $A^2$ each independently represents a substituted or unsubstituted six-membered aryl cyclic structure and the structures represented by $A^1$ and $A^2$ are condensed with each other.

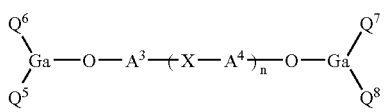

(5)

In the above general formula (5), $Q^5$ to $Q^8$ each independently represent a ligand represented by general formula (4); $A^3$ and $A^4$ represent a substituted or unsubstituted alkylene group having 1 to 30 carbon atoms, a substituted or unsubstituted divalent monocyclic group having 5 to 30 carbon atoms or a substituted or unsubstituted divalent condensed polycyclic group having 6 to 40 carbon atoms; X represents a substituted or unsubstituted alkylene group having 1 to 30 carbon atoms, O, S, SO$_2$, >C═O, >SiR$^{40}$R$^{41}$ or >NR$^{42}$; when $A^3$ and $A^4$ represent a substituted or unsubstituted alkylene group, X does not represent an alkylene group; n represents an integer of 0 to 2; $R^{40}$ to $R^{42}$ each independently represent hydrogen atom, a halogen atom, cyano group, nitro group, a substituted or unsubstituted alkyl group having 1 to 30 carbon atoms, a substituted or unsubstituted alkoxyl group having 1 to 30 carbon atoms, a substituted or unsubstituted aryloxyl group having 6 to 40 carbon atoms, a substituted or unsubstituted alkylthio group having 1 to 30 carbon atoms, a substituted or unsubstituted arylthio group having 6 to 40 carbon atoms, a substituted or unsubstituted monocyclic group having 5 to 40 carbon atoms, a substituted or unsubstituted condensed polycyclic group having 8 to 40 carbon atoms or a substituted or unsubstituted amino group; and adjacent groups represented by $R^{40}$ and $R^{41}$ may be bonded to each other to form a ring.

It is more preferable that, in general formula (3), at least one of $Q^1$ and $Q^2$ represents a ligand represented by the following general formula (6):

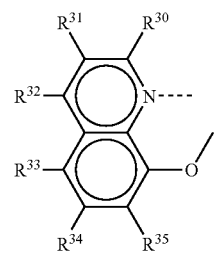

(6)

In the above general formula (6), $R^{30}$ to $R^{35}$ each independently represent hydrogen atom, a halogen atom, cyano group, nitro group, a substituted or unsubstituted alkyl group having 1 to 30 carbon atoms, a substituted or unsubstituted cycloalkyl group having 5 to 40 carbon atoms, a substituted or unsubstituted aryl group having 6 to 40 carbon atoms or a substituted or unsubstituted heterocyclic group having 2 to 40 carbon atoms.

Examples of the groups in general formulae (3) to (6) will be described in the following.

Examples of the halogen atom include fluorine atom, chlorine atom, bromine atom and iodine atom.

The amino group is represented by —NX$^1$X$^2$. $X^1$ and $X^2$ each independently represent methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, 1,2,3-trinitropropyl group, phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 4-styrylphenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylpheny group, p-(2-phenylpropyl)phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group, 2-pyrrolyl group, 3-pyrrolyl group, pyradinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxanyl group, 5-quinoxanyl group, 6-quinoxanyl group, 1-carbazolyl group, 2-carbazolyl group, 3-carbazolyl group, 4-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthrolin-2-yl group, 1,7-phenanthrolin-3-yl group, 1,7-phenanthrolin-4-yl group, 1,7-phenanthrolin-5-yl group, 1,7-phenanthrolin-6-yl group, 1,7-phenanthrolin-8-yl group, 1,7-phenanthrolin-9-yl group, 1,7-phenanthrolin-10-yl group, 1,8-phenanthrolin-2-yl group, 1,8-phenanthrolin-3-yl group, 1,8-phenanthrolin-4-yl group, 1,8-phenanthrolin-5-yl group, 1,8-phenanthrolin-6-yl group, 1,8-phenanthrolin-7-yl group, 1,8-phenanthrolin-9-yl group, 1,8-phenanthrolin-10-yl group, 1,9-phenanthrolin-2-yl group, 1,9-phenanthrolin-3-yl group, 1,9-phenanthrolin-4-yl group, 1,9-phenanthrolin-5-yl group, 1,9-phenanthrolin-6-yl group, 1,9-phenanthrolin-7-yl group, 1,9-phenanthrolin-8-yl group, 1,9-phenanthrolin-10-yl group, 1,10-phenanthrolin-2-yl group, 1,10-phenanthrolin-3-yl group, 1,10-phenanthrolin-4-yl group, 1,10-phenanthrolin-5-yl group, 2,9-phenanthrolin-1-yl group, 2,9-phenanthrolin-3-yl group, 2,9-phenanthrolin-4-yl group, 2,9-phenanthrolin-5-yl group, 2,9-phenanthrolin-6-yl group, 2,9-phenanthrolin-7-yl group, 2,9-phenanthrolin-8-yl group, 2,9-phenanthrolin-10-yl group, 2,8-phenanthrolin-1-yl group, 2,8-phenanthrolin-3-yl group, 2,8-phenanthrolin-4-yl group, 2,8-phenanthrolin-5-yl group, 2,8-phenanthrolin-6-yl group, 2,8-phenanthrolin-7-yl group, 2,8-phenanthrolin-9-yl group, 2,8-phenanthrolin-10-yl group, 2,7-phenanthrolin-1-yl group, 2,7-phenanthrolin-3-yl group, 2,7-phenanthrolin-4-yl group, 2,7-phenanthrolin-5-yl group, 2,7-phenanthrolin-6-yl group, 2,7-phenanthrolin-8-yl group, 2,7-phenanthrolin-9-yl group, 2,7-phenanthrolin-10-yl group, 1-phenazinyl group, 2-phenazinyl group, 1-phenothiazinyl group, 2-phenothiazinyl group, 3-phenothiazinyl group, 4-phenothiazinyl group, 1-phenoxazinyl group, 2-phenoxazinyl group, 3-phenoxazinyl group, 4-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrol-1-yl group, 2-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group or 4-t-butyl-3-indolyl group.

Examples of the alkyl group include methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxy-isopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group and 1,2,3-trinitropropyl group.

Examples of the cycloalkyl group include cyclopropyl group, cyclobutyl group, cyclopentyl group, cyclohexyl group and 4-methylcyclohexyl group.

The alkoxyl group is represented by —OY. Examples of the group represented by Y include methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxy-isopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group and 1,2,3-trinitropropyl group.

Examples of the heterocyclic group include 1-pyrrolyl group, 2-pyrrolyl group, 3-pyrrolyl group, pyradinyl group, 2-pyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxanyl group, 5-quinoxanyl group, 6-quinoxanyl group, 1-carbazolyl group, 2-carbazolyl group, 3-carbazolyl group, 4-carbazolyl group, 9-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthrolin-2-yl group, 1,7-phenanthrolin-3-yl group, 1,7-phenanthrolin-4-yl group, 1,7-phenanthrolin-5-yl group, 1,7-phenanthrolin-6-yl group, 1,7-phenanthrolin-8-yl group, 1,7-phenanthrolin-9-yl group, 1,7-phenanthrolin-10-yl group, 1,8-phenanthrolin-2-yl group, 1,8-phenanthrolin-3-yl group, 1,8-phenanthrolin-4-yl group, 1,8-phenanthrolin-5-yl group, 1,8-phenanthrolin-6-yl group, 1,8-phenanthrolin-7-yl group, 1,8-phenanthrolin-9-yl group, 1,8-phenanthrolin-10-yl group, 1,9-phenanthrolin-2-yl group, 1,9-phenanthrolin-3-yl group, 1,9-phenanthrolin-4-yl group, 1,9-phenanthrolin-5-yl group, 1,9-phenanthrolin-6-yl group, 1,9-phenanthrolin-7-yl group, 1,9-phenanthrolin-8-yl group, 1,9-phenanthrolin-10-yl group, 1,10-phenanthrolin-2-yl group, 1,10-phenanthrolin-3-yl group, 1,10-phenanthrolin-4-yl group, 1,10-phenanthrolin-5-yl group, 2,9-phenanthrolin-1-yl group, 2,9-phenanthrolin-3-yl group, 2,9-phenanthrolin-4-yl group, 2,9-phenanthrolin-5-yl group, 2,9-phenanthrolin-6-yl group, 2,9-phenanthrolin-7-yl group, 2,9-phenanthrolin-8-yl group, 2,9-phenanthrolin-10-yl group, 2,8-phenanthrolin-1-yl group, 2,8-phenanthrolin-3-yl group, 2,8-phenanthrolin-4-yl group, 2,8-phenanthrolin-5-yl group, 2,8-phenanthrolin-6-yl group, 2,8-phenanthrolin-7-yl group, 2,8-phenanthrolin-9-yl group, 2,8-phenanthrolin-10-yl group, 2,7-phenanthrolin-1-yl group, 2,7-phenanthrolin-3-yl group, 2,7-phenanthrolin-4-yl group, 2,7-phenanthrolin-5-yl group, 2,7-phenanthrolin-6-yl group, 2,7-phenanthrolin-8-yl group, 2,7-phenanthrolin-9-yl group, 2,7-phenanthrolin-10-yl group, 1-phenazinyl group, 2-phenazinyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrol-1-yl group, 2-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group and 4-t-butyl-3-indolyl group.

The aryloxyl group is represented by —OZ. Examples of the group represented by Z include phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthryl group, 4'-methylbiphenylyl group, 4''-t-butyl-p-terphenyl-4-yl group, 2-pyrrolyl group, 3-pyrrolyl group, pyradinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxanyl group, 5-quinoxanyl group, 6-quinoxanyl group, 1-carbazolyl group, 2-carbazolyl group, 3-carbazolyl group, 4-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthrolin-2-yl group, 1,7-phenanthrolin-3-yl group, 1,7-phenanthrolin-4-yl group, 1,7-phenanthrolin-5-yl group, 1,7-phenanthrolin-6-yl group, 1,7-phenanthrolin-8-yl group, 1,7-phenanthrolin-9-yl group, 1,7-phenanthrolin-10- yl group, 1,8-phenanthrolin-2-yl group, 1,8-phenanthrolin-3-yl group, 1,8-phenanthrolin-4-yl group, 1,8-phenanthrolin-5-yl group, 1,8-phenanthrolin-6-yl group, 1,8-phenanthrolin-7-yl group, 1,8-phenanthrolin-9-yl group, 1,8-phenanthrolin-10-yl group, 1,9-phenanthrolin-2-yl group, 1,9-phenanthrolin-3-yl group, 1,9-phenanthrolin-4-yl group, 1,9-phenanthrolin-5-yl group, 1,9-phenanthrolin-6-yl group, 1,9-phenanthrolin-7-yl group, 1,9-phenanthrolin-8-yl group, 1,9-phenanthrolin-10-yl group, 1,10-phenanthrolin-2-yl group, 1,10-phenanthrolin-3-yl group, 1,10-phenanthrolin-4-yl group, 1,10-phenanthrolin-5-yl group, 2,9-phenanthrolin-1-yl group, 2,9-phenanthrolin-3-yl group, 2,9-phenanthrolin-4-yl group, 2,9-phenanthrolin-5-yl group, 2,9-phenanthrolin-6-yl group, 2,9-phenanthrolin-7-yl group, 2,9-phenanthrolin-8-yl group, 2,9-phenanthrolin-10-yl group, 2,8-phenanthrolin-1-yl group, 2,8-phenanthrolin-3-yl group, 2,8-phenanthrolin-4-yl group, 2,8-phenanthrolin-5-yl group, 2,8-phenanthrolin-6-yl group, 2,8-phenanthrolin-7-yl group, 2,8-phenanthrolin-9-yl group, 2,8-phenanthrolin-10-yl group, 2,7-phenanthrolin-1-yl group, 2,7-phenanthrolin-3-yl group, 2,7-phenanthrolin-4-yl group, 2,7-phenanthrolin-5-yl group, 2,7-phenanthrolin-6-yl group, 2,7-phenanthrolin-8-yl group, 2,7-phenanthrolin-9-yl group, 2,7-phenanthrolin-10-yl group, 1-phenazinyl group, 2-phenazinyl group, 1-phenothiazinyl group, 2-phenothiazinyl group, 3-phenothiazinyl group, 4-phenothiazinyl group, 1-phenoxazinyl group, 2-phenoxazinyl group, 3-phenoxazinyl group, 4-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrol-1-yl group, 2-methylpyrrol-3-yl group, 2-methylpyrrol-4-yl group, 2-methylpyrrol-5-yl group, 3-methylpyrrol-1-yl group, 3-methylpyrrol-2-yl group, 3-methylpyrrol-4-yl group, 3-methylpyrrol-5-yl group, 2-t-butylpyrrol-4-yl group, 3-(2-phenylpropyl)pyrrol-1-yl group, 2-methyl-1-indolyl group, 4-methyl-1-indolyl group, 2-methyl-3-indolyl group, 4-methyl-3-indolyl group, 2-t-butyl-1-indolyl group, 4-t-butyl-1-indolyl group, 2-t-butyl-3-indolyl group and 4-t-butyl-3-indolyl group.

Examples of the aryl group include phenyl group, naphthyl group, anthryl group, phenanthryl group, naphthaceyl group and pyrenyl group. Examples of the substituent to the aryl group include halogen atoms, hydroxyl group, substituted or unsubstituted amino groups described above, nitro group, cyano group, substituted or unsubstituted alkyl groups described above, substituted or unsubstituted alkenyl groups described above, substituted or unsubstituted cycloalkyl groups described above, substituted or unsubstituted alkoxyl groups described above, substituted or unsubstituted aromatic hydrocarbon groups described above, substituted or unsubstituted aromatic heterocyclic groups described above, substituted or unsubstituted aralkyl groups described above, substituted or unsubstituted aryloxyl groups described above, substituted or unsubstituted alkoxycarbonyl groups described above and carboxyl group.

As the metal complex, the complex represented by the following general formula (7) is also preferable.

$$[((R^s)_m\text{-}Q')_{3-k}Al]_xL'_k \qquad (7)$$

In the above general formula (7), x represents 1 or 2 when k represents 1 and represents 1 when k represents 2 and m represents a number of 1 to 6. L' represents a group represented by —R', —Ar', —OR', —OAr', —OR'Ar', —OC(O)R', —OC(O)Ar', —OP(O)R'$_2$, —SeAr', —TeAr', —SAr', —X', —OP(O)Ar'$_2$, —OS(O$_2$)R', —OS(O$_2$)Ar', —OSiR'$_3$, —OB(OR')$_2$, —OSiAr'—$_3$, —OAr'O— or —OC(O)Ar'C(O)O—, wherein R' represents a hydrocarbon group having 1 to 6 carbon atoms, X' represents a halogen atom, Ar' represents an aryl group having 6 to 36 carbon atoms and, when k and x represent 1, the ligand is not phenol. Q' represents a substituted 8-quinolinolato ligand and R$^s$ represents a substituent to the 8-quinolinolato ring.

In general formula (7), examples of the hydrocarbon group, the halogen and the aryl group include the atoms and the groups described as the examples of the corresponding atoms and groups in the above.

Specific examples of the metal complex include compounds expressed by the following formulae (1) to (32):

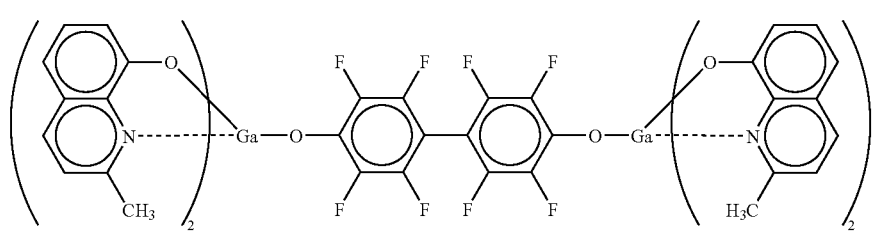

(1)

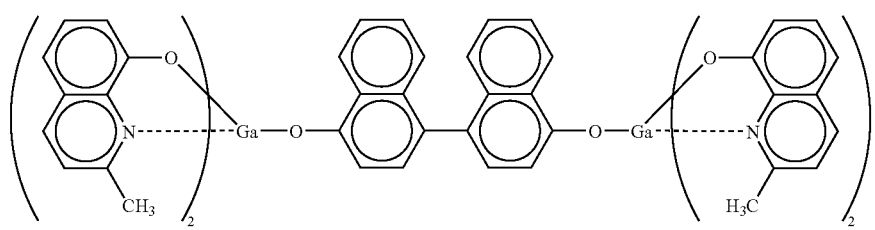

(2)

-continued
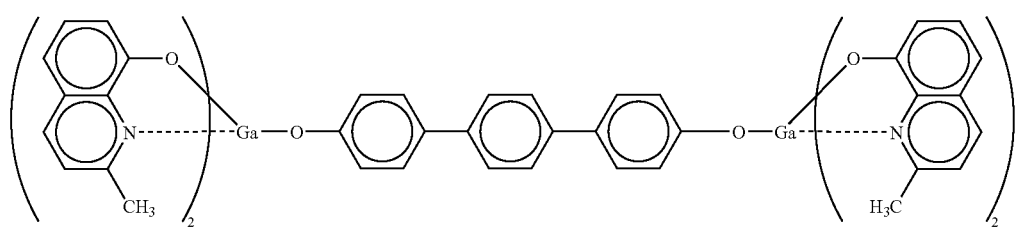
(3)
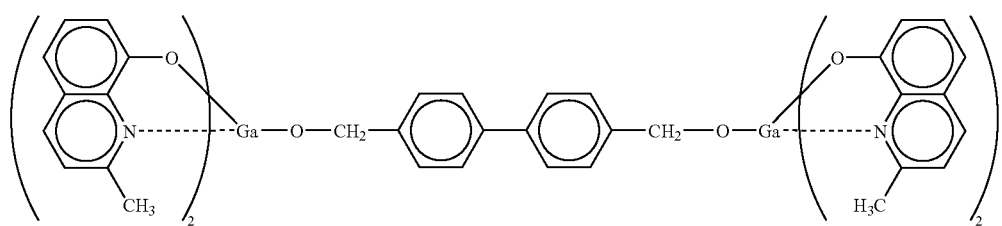
(4)
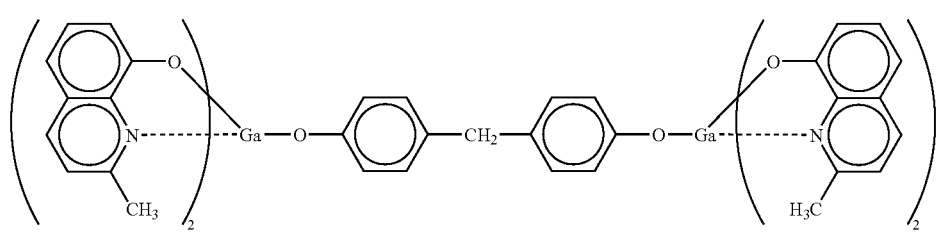
(5)
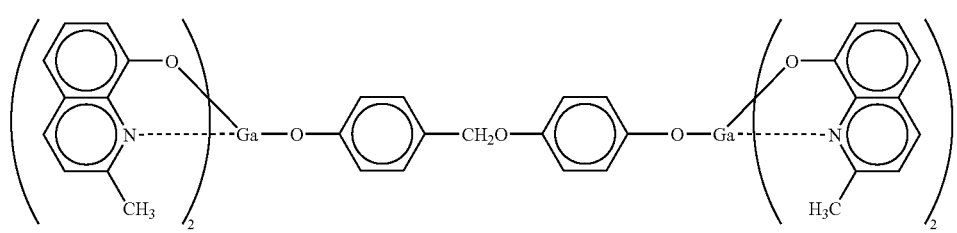
(6)
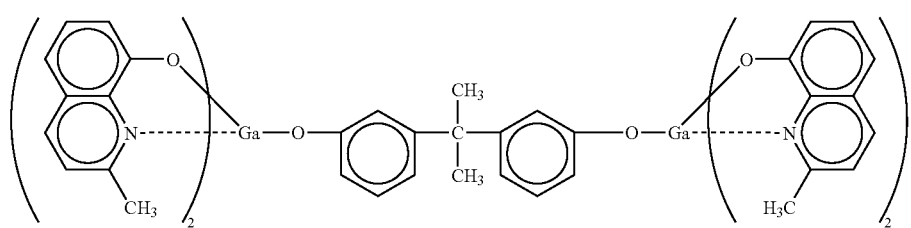
(7)
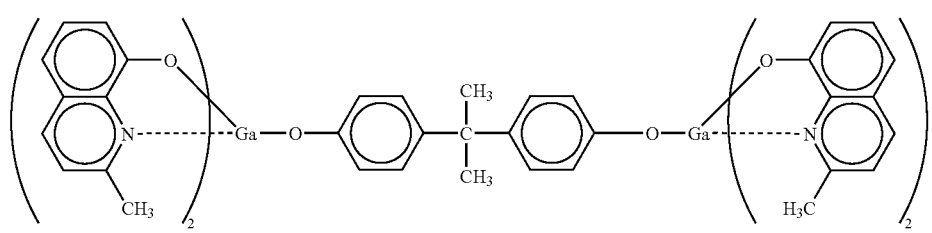
(8)
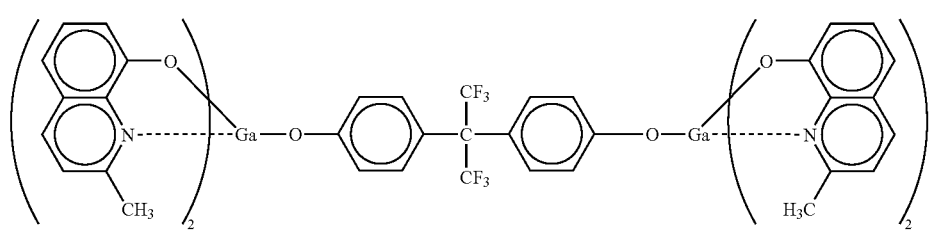
(9)

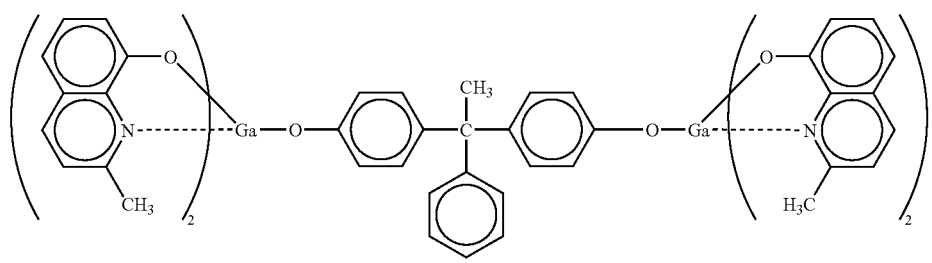
(10)
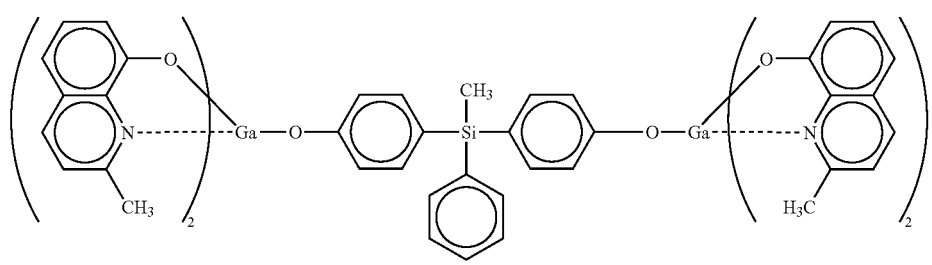
(11)
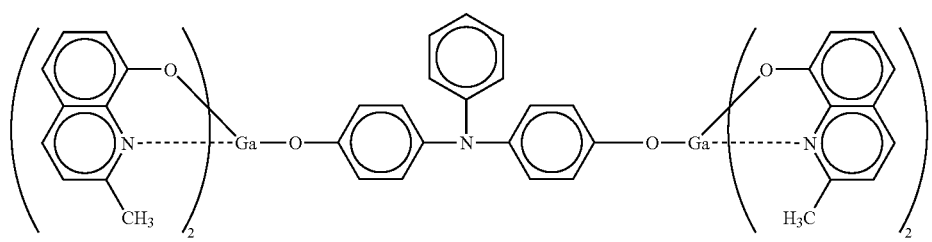
(12)
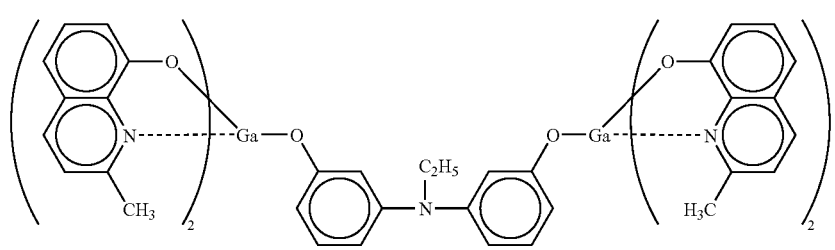
(13)
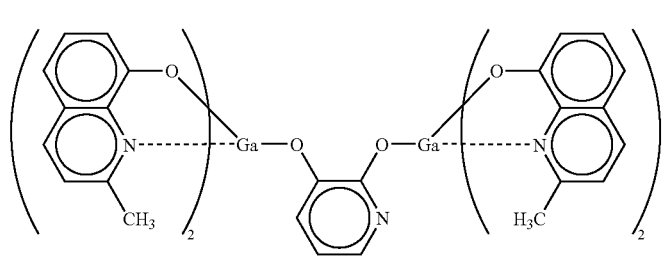
(14)
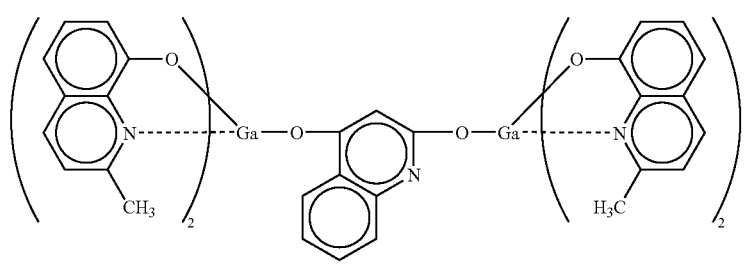
(15)

-continued
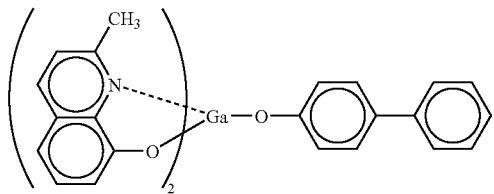 (16)
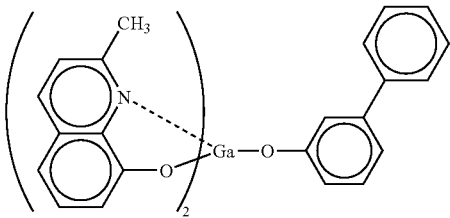 (17)
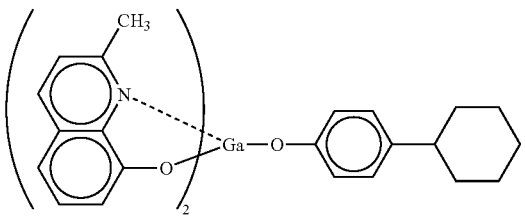 (18)
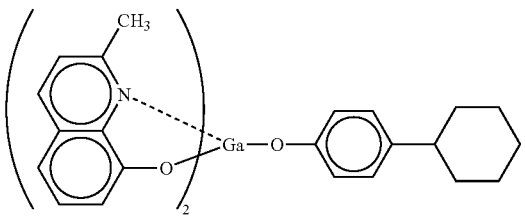 (19)
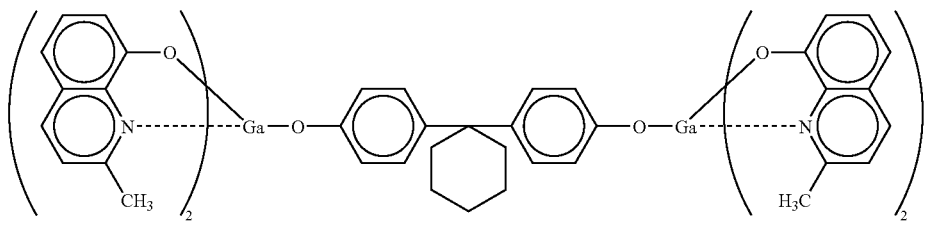 (20)
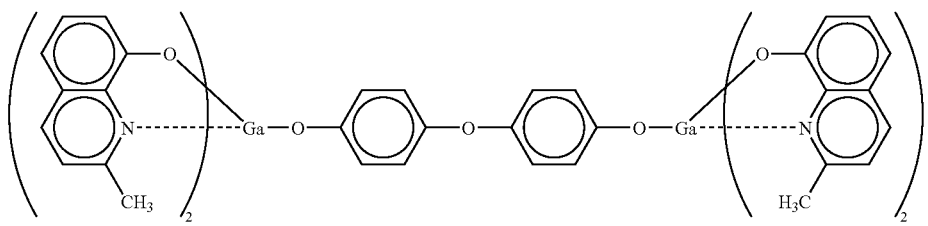 (21)
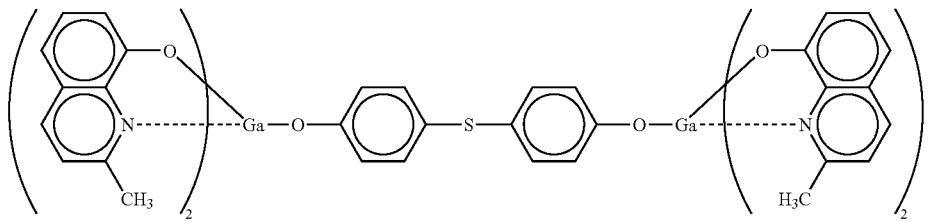 (22)
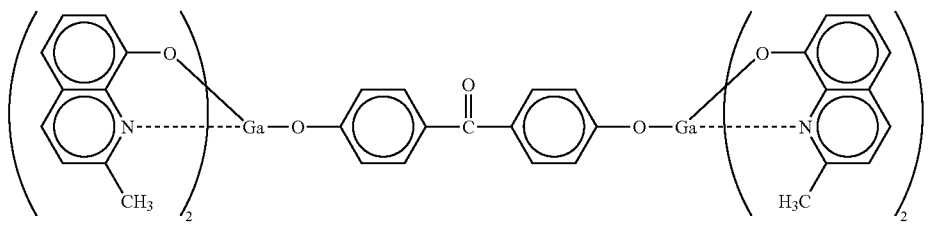 (23)
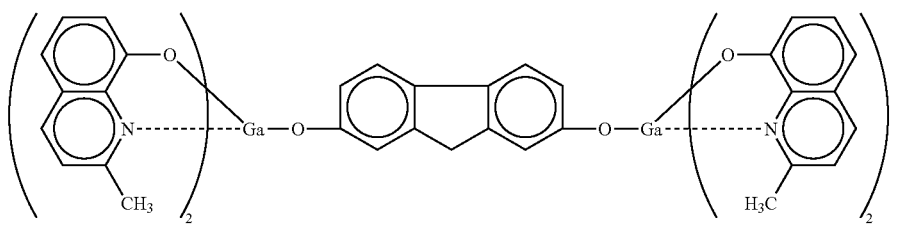 (24)

-continued

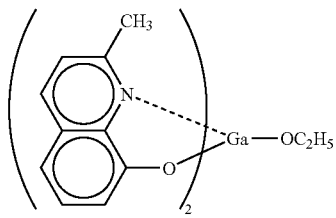
(25)

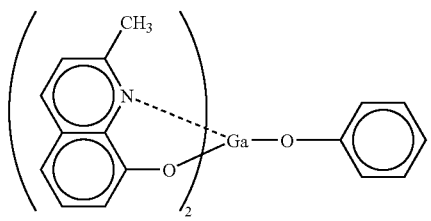
(26)

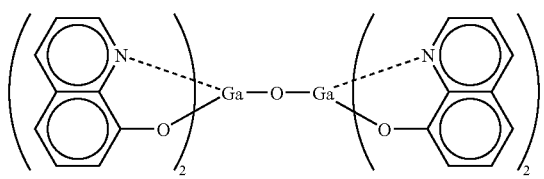
(27)

(28)

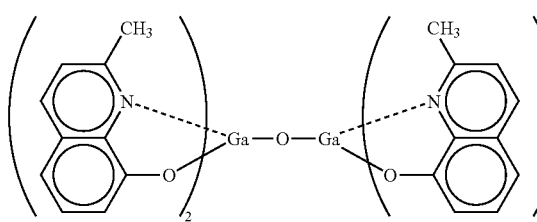
(29)

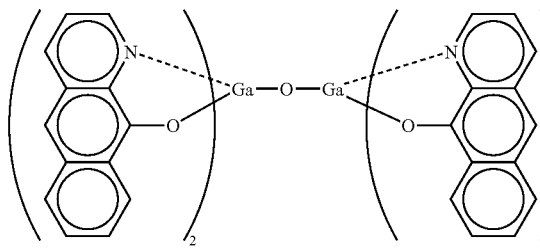
(30)

(31)

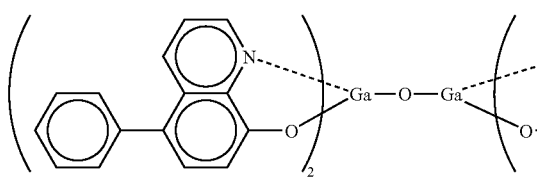

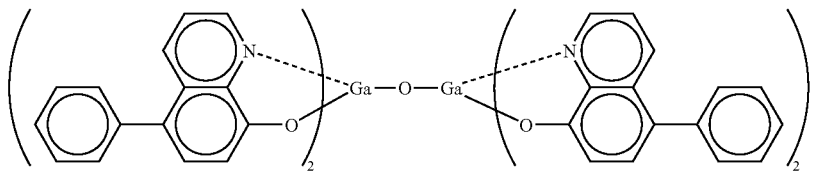
(32)

In the present invention, it is preferable that the layer of an organic thin film comprises a light emitting layer comprising a diarylanthracene derivative or a diarylbisanthracene derivative and the hole transporting layer adjacent to the light emitting layer comprises an N,N,N',N'-tetra(biphenyl)diaminoarylene derivative.

By laminating the layer comprising a specific N,N,N',N'-tetra(biphenyl)diaminoarylene derivative to the light emitting layer, the balance between the amounts of electrons and holes is improved. Therefore, injection of holes into the electron injecting layer is suppressed and deterioration of the electron injecting layer is prevented. As the result, the organic EL device can exhibit a higher efficiency and have a longer life.

In the present invention, further improvements in the performance can be achieved by laminating the layer comprising a specific N,N,N',N'-tetra(biphenyl)diaminoarylene derivative and further by using a layer of a metal complex having an energy gap of 2.8 eV or greater as the electron injecting layer.

As the N,N,N',N'-tetra(biphenyl)diaminoarylene derivative, compounds represented by the following general formulae (10) and (11) are preferable.

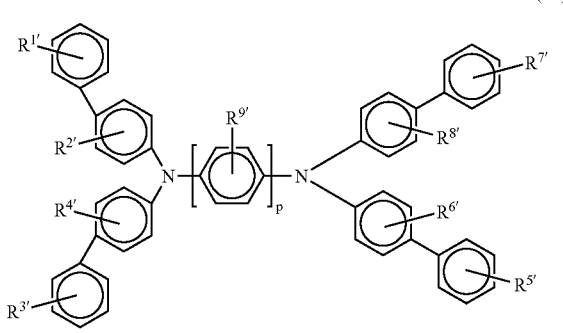

(10)

In the above general formula (10), $R^{1\prime}$ to $R^{9\prime}$ each independently represent hydrogen atom, an alkyl group having 1 to 6 carbon atoms, an alkoxyl group having 1 to 6 carbon atoms or a substituted or unsubstituted phenyl group, the atom or the groups represented by $R^{1\prime}$ to $R^{9\prime}$ may be the same with or different from each other, pairs of groups represented by $R^{1\prime}$ and $R^{2\prime}$, $R^{2\prime}$ and $R^{4\prime}$, $R^{3\prime}$ and $R^{4\prime}$, $R^{5\prime}$ and $R^{6\prime}$, $R^{6\prime}$ and $R^{8\prime}$, $R^{7\prime}$ and $R^{8\prime}$, $R^{2\prime}$ and $R^{9\prime}$, $R^{4\prime}$ and $R^{9\prime}$, $R^{6\prime}$ and $R^{9\prime}$ and $R^{8\prime}$ and $R^{9\prime}$ may be bonded to each other to form a ring and p represents an integer of 1 to 4.

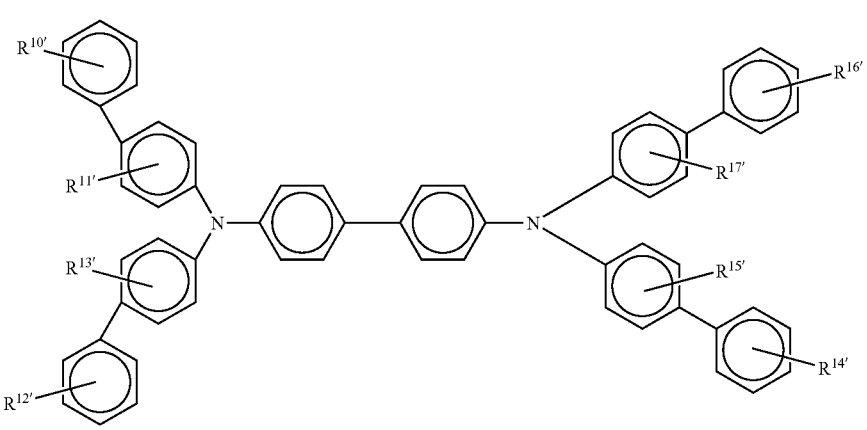

(11)

In the above general formula (11), $R^{10\prime}$ to $R^{17\prime}$ each independently represent hydrogen atom, an alkyl group having 1 to 6 carbon atoms, an alkoxyl group having 1 to 6 carbon atoms or a substituted or unsubstituted phenyl group, the atom or the groups represented by $R^{10\prime}$ to $R^{17\prime}$ may be the same with or different from each other, pairs of groups represented by $R^{10\prime}$ and $R^{11\prime}$, $R^{11\prime}$ and $R^{13\prime}$, $R^{12\prime}$ and $R^{13\prime}$, $R^{14\prime}$ and $R^{15\prime}$, $R^{15}$ and $R^{17\prime}$ and $R^{16\prime}$, and $R^{17\prime}$ may be bonded to each other to form a ring and the formed ring may further have a substituent.

Preferable examples of the N,N,N',N'-tetra(biphenyl)diamino-arylene derivative include N,N,N',N'-tetra(4-biphenyl)diaminoarylenes. Preferable examples of the arylene include biphenylene, fluorenyl, terphenylene and quaterphenylene which may be substituted or unsubstituted.

The organic EL device of the present invention has a laminate structure having one or more organic layers laminated between the electrodes. Examples of the structure include structures of an anode/a light emitting layer/a cathode, an anode/a hole transporting layer/a light emitting layer/an electron transporting layer/a cathode, an anode/a hole transporting layer/a light emitting layer/a cathode and an anode/a light emitting layer/an electron transporting layer/a cathode. The compound described in the present invention may be used in any of the above layers of an organic thin film and may also be used by doping into other hole transporting materials, light emitting materials and electron transporting materials.

In the organic EL device of the present invention, it is preferable that a region transporting electrons or an interface region between the cathode and a layer of an organic thin film comprises a reducing dopant. The reducing dopant is defined as a substance which reduces an electron transporting compound. Therefore, various types of substances can be used as long as the substance has the specific reducing property. For example, at least one substance selected from the group consisting of alkali metals, alkaline earth metals, rare earth metals, oxides of alkali metals, halides of alkali metals, oxides of alkaline earth metals, halides of alkaline earth metals, oxides of rare earth metals, halides of rare earth metals, organic complexes of alkali metals, organic complexes of alkaline earth metals and organic complexes of rare earth metals can be used.

Examples of the reducing dopant include at least one alkali metal selected from the group consisting of Na (the work function: 2.36 eV), K (the work function: 2.28 eV), Rb (the work function: 2.16 eV) and Cs (the work function: 1.95 eV) and at least one alkaline earth metal selected from the group consisting of Ca (the work function: 2.9 eV), Sr (the work function: 2.0 to 2.5 eV) and Ba (the work function: 2.52 eV). Among these reducing dopants, reducing dopants having a work function of 2.9 eV or smaller are preferable. More preferable reducing dopants are at least one alkali metal selected from the group consisting of K, Rb and Cs. Still more preferable reducing dopants are Rb and Cs and the most preferable reducing dopant is Cs. These alkali metals have high reducing ability and the luminance of emitted light and the life of the organic EL device are improved by adding these alkali metals in a relatively small amount into the region of electron injection. As the reducing dopant having a work function of 2.9 eV or smaller, combinations of two or more alkali metals are preferable and combinations including Cs such as combinations of Cs and Na, Cs and K, Cs and Rb, and Cs, Na and K are more preferable. When Cs is include in the combination, the reducing ability can be efficiently exhibited and the luminance of emitted light and the life of the organic EL device can be improved by adding the combination into the region of electron injection.

In the present invention, an electron injecting layer constituted with an insulating material or a semiconductor may be disposed between the cathode and the layer of an organic thin film. By disposing the electron injecting layer, leak of electric current can be effectively prevented and the electron injecting property can be improved. It is preferable that at least one metal compound selected from the group consisting of alkali metal chalcogenides, alkaline earth metal chalcogenides, alkali metal halides and alkaline earth metal halides is used as the insulating material. It is preferable that the electron injecting layer is constituted with the alkali metal chalcogenide or the like since the electron injecting property can be further improved. Preferable examples of the alkali metal chalcogenide include $Li_2O$, LiO, $Na_2S$, $Na_2Se$ and NaO. Preferable examples of the alkaline earth chalcogenide include CaO, BaO, SrO, BeO, BaS and CaSe. Preferable examples of the alkali metal halide include LiF, NaF, KF, LiCl, KCl and NaCl. Preferable examples of the alkaline earth metal halide include fluorides such as $CaF_2$, $BaF_2$, $SrF_2$, $MgF_2$ and $BeF_2$ and halides other than the fluorides.

Examples of the semiconductor constituting the electron transporting layer include oxides, nitrides and oxide nitrides containing at least one element selected from Ba, Ca, Sr, Yb, Al, Ga, In, Li, Na, Cd, Mg, Si, Ta, Sb and Zn used singly or as a combination of two or more. It is preferable that the inorganic compound constituting the electron transporting layer is in the form of a fine crystalline or amorphous insulating thin film. When the electron transporting layer is constituted with the above insulating thin film, a more uniform thin film can be formed and defects of pixels such as dark spots can be decreased. Examples of the inorganic compound include the alkali metal chalcogenides, the alkaline earth metal chalcogenides, the alkali metal halides and the alkaline earth metal halides which are described above.

The anode of the organic EL device plays the role of injecting holes into the hole transporting layer or the light emitting layer. It is effective that the anode has a work function of 4.5 eV or greater. Examples of the material of the anode used in the present invention include indium tin oxide alloys (ITO), tin oxides (NESA), gold, silver, platinum and copper. As the cathode, a material having a small work function is preferable so that electrons can be injected into the electron transporting layer or the light emitting layer.

The material of the cathode is not particularly limited. Examples of the material of the cathode include indium, aluminum, magnesium, magnesium-indium alloys, magnesium-aluminum alloys, aluminum-lithium alloys, aluminum-scandium-lithium alloys and magnesium-silver alloys.

The process for forming the layers in the organic EL device of the present invention is not particularly limited. A conventional process such as the vacuum vapor deposition and the spin coating can be used. The layer of an organic thin film containing the light emitting compound represented by the above general formula (1) which is used in the present invention can be formed in accordance with the vacuum vapor deposition process or the molecular beam epitaxy process (the MBE process). The layer of an organic thin film can be formed also from a solution prepared by dissolving the material into a solvent in accordance with a conventional coating process such as the dipping process, the spin coating process, the casting process, the bar coating process and the roll coating process.

The thickness of each layer in the layer of an organic thin film in the organic EL device of the present invention is not particularly limited. In general, an excessively thin layer tends to have defects such as pin holes and an excessively thick layer requires a high applied voltage to decrease the efficiency. Therefore, a thickness in the range of several nm to 1 μm is preferable.

The present invention will be described more specifically with reference to examples in the following. However, the present invention is not limited to the examples.

SYNTHESIS EXAMPLE 1

Into a flask, 1.0 g of trimethoxygallium and 40 ml of anhydrous ethanol were placed and stirred. To the resultant solution, 0.84 g of 4-hydroxybiphenyl was added and the obtained mixture was stirred at 80° C. for 7 hours. Major portions of the solid substance separated as precipitates were dissolved into a hot ethanol and the resultant solution was filtered. The obtained filtrate was concentrated and the resultant concentrate was dried in vacuo to obtain 1.5 g of a yellowish white powder. The yellowish white powder was analyzed in accordance with the mass analysis and found to be gallium chelate compound (28) shown above. The energy gap was measured from absorption end of the light absorption spectrum and found to be 2.95 eV.

SYNTHESIS EXAMPLE 2

The same procedures as those conducted in Synthesis Example 1 were conducted except that 0.59 g of 4-cyanophenol was used in place of 0.84 g of 4-hydroxybiphenyl and 1.4 g of a yellowish white powder was obtained. The yellowish white powder was analyzed in accordance with the mass analysis and found to be gallium chelate compound (17) shown above. The energy gap was measured from absorption end of the light absorption spectrum and found to be 2.96 eV.

SYNTHESIS EXAMPLE 3

The same procedures as those conducted in Synthesis Example 1 were conducted except that 0.47 g of phenol was used in place of 0.84 g of 4-hydroxybiphenyl and 1.3 g of a yellowish white powder was obtained. The yellowish white powder was analyzed in accordance with the mass analysis and found to be gallium chelate compound (27) shown above. The energy gap was measured from absorption end of the light absorption spectrum and found to be 2.93 eV.

The chemical structures of the compounds used in Examples and Comparative Examples are shown in the following. The ionization energy and the electron affinity of these compounds are shown in Table 1.

TABLE 1
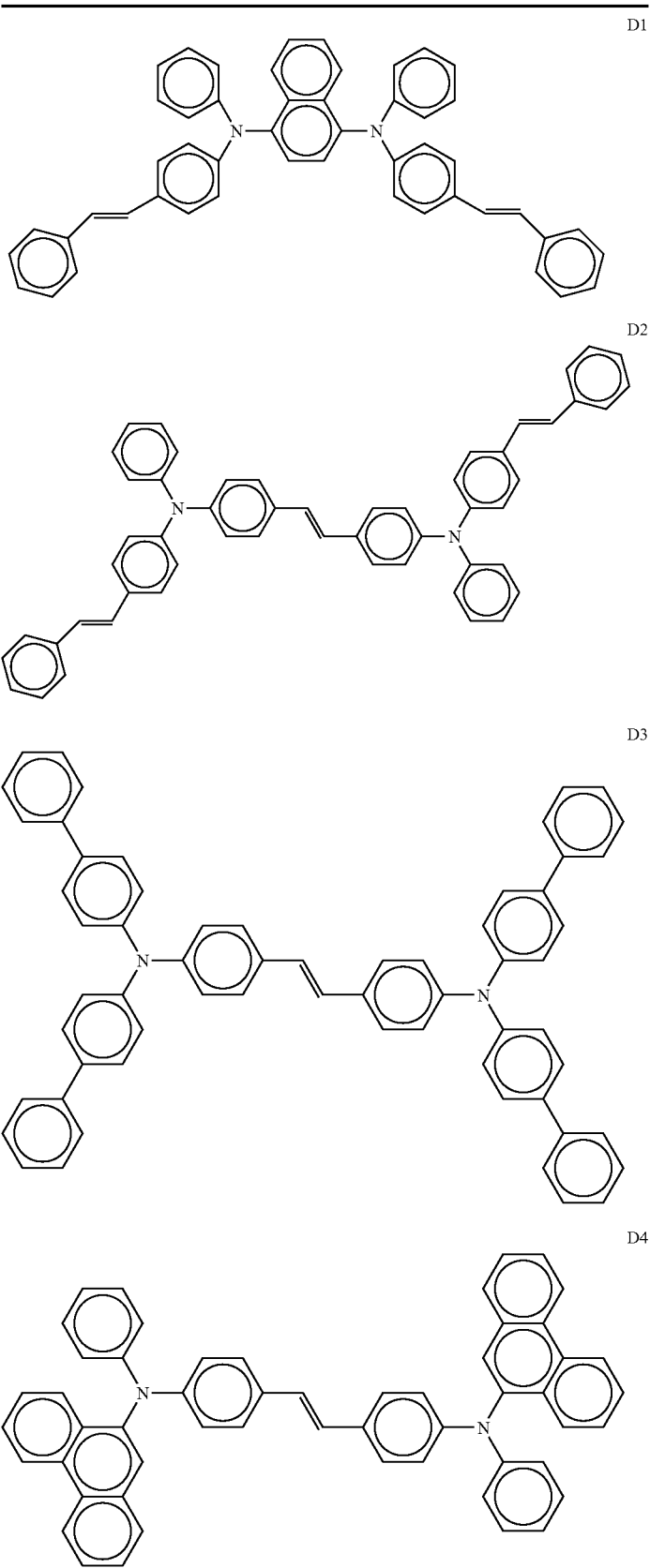

TABLE 1-continued
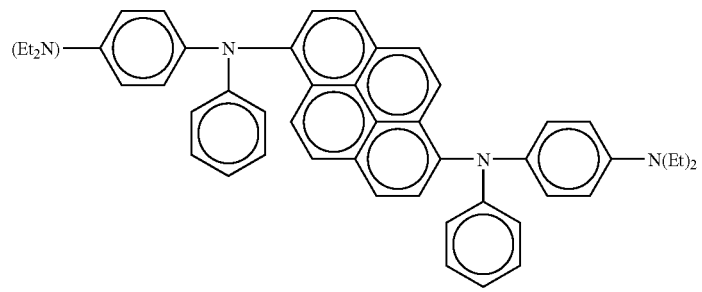
D5
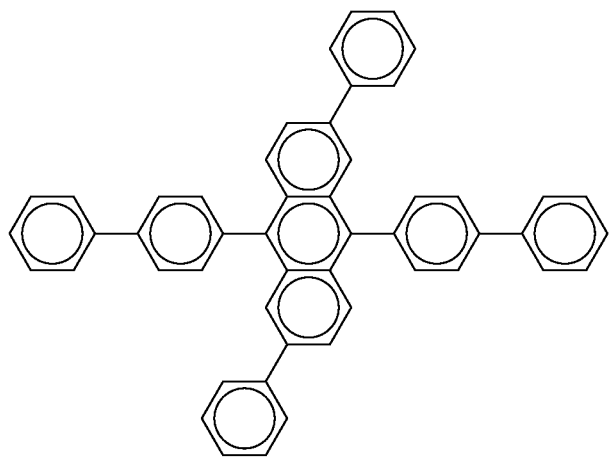
C1
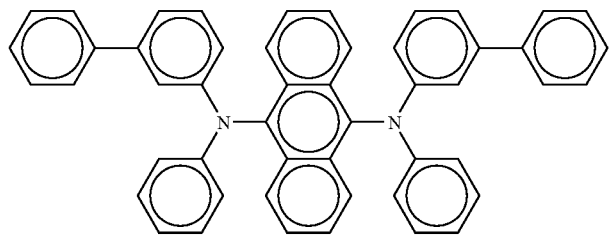
C2
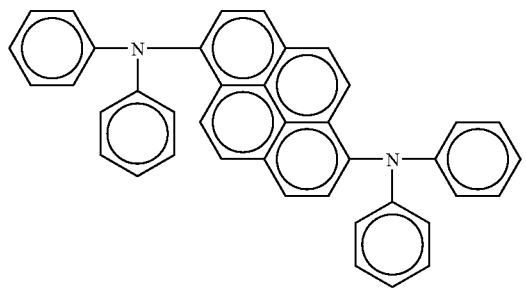
C3
E1

TABLE 1-continued

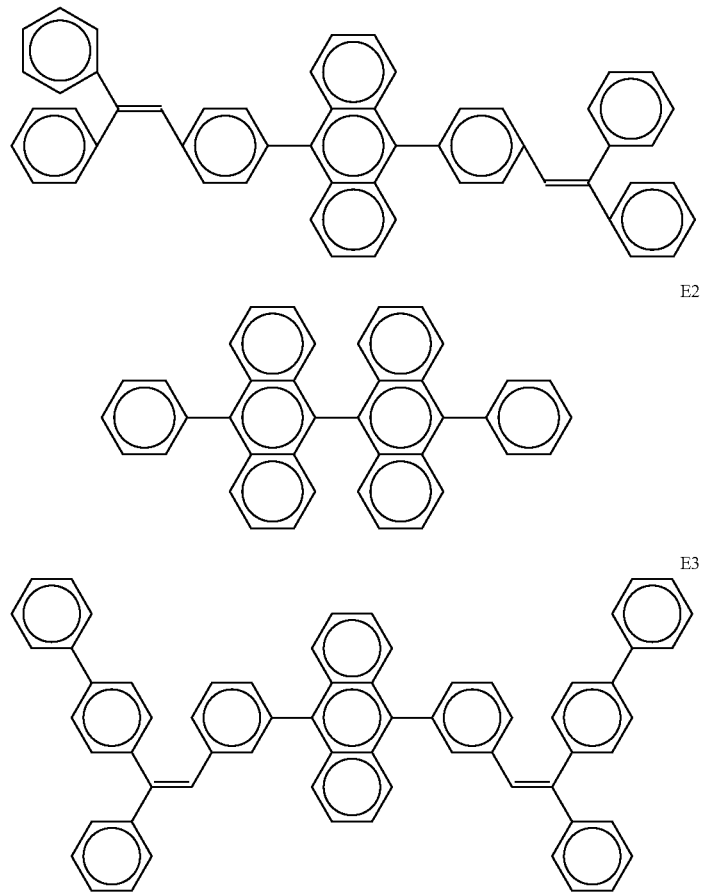

| Compound | Ionization energy (eV) | Electron affinity (eV) |
|---|---|---|
| (E1) | 5.70 | 2.80 |
| (E2) | 5.72 | 2.73 |
| (E3) | 5.80 | 2.79 |
| (D1) | 5.35 | 2.45 |
| (D2) | 5.41 | 2.53 |
| (D3) | 5.39 | 2.51 |
| (D4) | 5.37 | 2.56 |
| (D5) | 5.23 | 2.65 |
| (C1) | 5.62 | 2.89 |
| (C2) | 5.75 | 3.25 |
| (C3) | 5.52 | 2.78 |

The ionization energy (Ip) was measured by using an atmospheric photoelectronic spectrophotometer AC1 manufactured by RIKEN KEIKI Co., Ltd. The electron affinity (Af) was obtained by deciding the value of energy gap (Eg) from the energy value at the absorption end of light absorption of a molecule, followed by calculation using the relation Af=Ip−Eg.

EXAMPLE 1

A glass substrate (manufactured by GEOMATEC Company) of 25 mm×75 mm×1.1 mm thickness having an ITO transparent electrode was cleaned by application of ultrasonic wave in isopropyl alcohol for 5 minutes and then by exposure to ozone generated by ultraviolet light for 30 minutes. The glass substrate having the transparent electrode lines which had been cleaned was attached to a substrate holder of a vacuum vapor deposition apparatus. On the surface of the cleaned substrate at the side having the transparent electrode, a film of N,N'-bis(N,N'-diphenyl-4-aminophenyl)-N,N'-diphenyl-4,4'-diamino-1,1'-biphenyl (TPD232) having a thickness of 60 nm was formed in a manner such that the formed film covered the transparent electrode. The formed film of TPD232 worked as the hole injecting layer. After the formation of the film of TPD232, a film of 4,4'-bis[N-(1-naphthyl)-N-phenylamino]biphenyl (NPD) having a thickness of 20 nm was formed on the formed film of TPD232. The formed film of NPD worked as the hole transporting layer. After the formation of the film of NPD, a film of the above compound (E1) as the host material having a thickness of 40 nm was formed on the formed film of NPD by vapor deposition. At the same time, the above amine compound having styryl group (D1) as the light emitting molecule was vapor deposited in an amount such that the ratio of the amounts by weight of compound (D1) to compound (E1) was 3:40. The formed film worked as the light emitting layer. On the film formed above, a film of the above metal complex (16) having a thickness of 20 nm was formed. The film of metal complex (16) worked as the electron injecting layer. The laminate of compound (E1): amine compound (D1)/metal complex (16) worked as the light emitting medium emitting blue light. Thereafter, Li (the source of lithium: manufactured by SAES GETTERS Company) as the reducing dopant and Alq were binary vapor deposited and an Alq:Li film having a thickness of 10 nm was formed as the electron injecting layer (the cathode). On the formed Alq:Li film, metallic aluminum was vapor deposited to form a metal cathode and an organic EL device was prepared. When a direct current voltage of 5 V was applied to the organic EL device prepared above, blue light was emitted at a luminance of 200 cd/m$^2$ and an efficiency of the light emission of 8.5 cd/A. The device was driven by continuously passing a current constantly at an initial luminance of 500 cd/m$^2$ and the time before the luminance decreased to the half of the original value (the half-life) was found to be 3,200 hours.

EXAMPLE 2

An organic EL device was prepared in accordance with the same procedures as those conducted in Example 1 except that amine compound (D2) was used in place of amine compound (D1). The luminance of the emitted light, the efficiency of the light emission and the color of the emitted light under application of a direct current voltage of 6 V and the half-life of the light emission at the initial luminance of 500 cd/m$^2$ of this device are shown in Table 2.

EXAMPLE 3

An organic EL device was prepared in accordance with the same procedures as those conducted in Example 1 except that amine compound (D3) was used in place of amine compound (D1). The luminance of the emitted light, the efficiency of the light emission and the color of the emitted light under application of a direct current voltage of 6 V and the half-life of the light emission at the initial luminance of 500 cd/m$^2$ of this device are shown in Table 2.

EXAMPLE 4

An organic EL device was prepared in accordance with the same procedures as those conducted in Example 1 except that amine compound (D4) was used in place of amine compound (D1). The luminance of the emitted light, the efficiency of the light emission and the color of the emitted light under application of a direct current voltage of 6 V and the half-life of the light emission at the initial luminance of 500 cd/m$^2$ of this device are shown in Table 2.

EXAMPLE 5

An organic EL device was prepared in accordance with the same procedures as those conducted in Example 1 except that amine compound (D5) was used in place of amine compound (D1). The luminance of the emitted light, the efficiency of the light emission and the color of the emitted light under application of a direct current voltage of 6 V and the half-life of the light emission at the initial luminance of 500 cd/m$^2$ of this device are shown in Table 2.

COMPARATIVE EXAMPLE 1

An organic EL device was prepared in accordance with the same procedures as those conducted in Example 1 except that amine compound (D3) was used in place of amine compound (D1) and compound (C1) was used in place of compound (E1) in the light emitting layer. The luminance of the emitted light, the efficiency of the light emission and the color of the emitted light under application of a direct current voltage of 6 V and the half-life of the light emission at the initial luminance of 500 cd/m$^2$ of this device are shown in Table 2.

COMPARATIVE EXAMPLE 2

An organic EL device was prepared in accordance with the same procedures as those conducted in Example 1 except that amine compound (D3) was used in place of amine compound (D1) and compound (C2) was used in place of compound (E1) in the light emitting layer. The luminance of the emitted light, the efficiency of the light emission and the color of the emitted light under application of a direct current voltage of 6 V and the half-life of the light emission at the initial luminance of 500 cd/m$^2$ of this device are shown in Table 2.

COMPARATIVE EXAMPLE 3

An organic EL device was prepared in accordance with the same procedures as those conducted in Example 1 except that amine compound (D3) was used in place of amine compound (D1) and compound (C3) was used in place of compound (E1) in the light emitting layer. The luminance of the emitted light, the efficiency of the light emission and the color of the emitted light under application of a direct current voltage of 6 V and the half-life of the light emission at the initial luminance of 500 cd/m$^2$ of this device are shown in Table 2.

COMPARATIVE EXAMPLE 4

An organic EL device was prepared in accordance with the same procedures as those conducted in Example 1 except that aluminum complex of 8-hydroxyquinoline was used in place of metal complex (16). The luminance of the emitted light, the efficiency of the light emission and the color of the emitted light under application of a direct current voltage of 6 V and the half-life of the light emission at the initial luminance of 500 cd/m² of this device are shown in Table 2.

(NPD) was used in place of compound (E1) in the light emitting layer. NPD had an ionization energy of 5.40 eV and an electron affinity of 2.40 eV. The luminance of the emitted light, the efficiency of the light emission and the color of the emitted light under application of a direct current voltage of 6 V and the half-life of the light emission at the initial luminance of 500 cd/m² of this device are shown in Table 3.

TABLE 2

| | Amine compound | Voltage (V) | Luminance of emitted light (nit) | Efficiency of light emission (cd/A) | Color of emitted light | Half-life (hour) |
|---|---|---|---|---|---|---|
| Example 1 | (D1) | 5 | 200 | 8.5 | blue | 3200 |
| Example 2 | (D2) | 6 | 250 | 8.5 | blue | 2200 |
| Example 3 | (D3) | 6 | 196 | 7.7 | blue | 3500 |
| Example 4 | (D4) | 6 | 278 | 6.8 | blue | 2900 |
| Example 5 | (D5) | 6 | 420 | 11.2 | green | 4500 |
| Comparative Example 1 | (C1) | 6 | 30 | 1.2 | blue | 300 |
| Comparative Example 2 | (C2) | 6 | 275 | 8.4 | green | 600 |
| Comparative Example 3 | (C3) | 6 | 160 | 3.2 | blue | 680 |
| Comparative Example 4 | (D1) | 6 | 120 | 4.0 | blue | 1200 |

As shown in Table 2, the organic EL devices of Examples 1 to 5 exhibited higher efficiencies of the light emission and had longer lives than those of the organic EL devices of Comparative Examples 1 to 4. The organic EL devices of Examples 2 to 4 emitted blue light having excellent purity at higher efficiency than conventional devices. When the results of Comparative Example 4 and Example 1 were compared, it was found that the efficiency of the light emission and the life could be improved by using the laminate of the layer of the host material containing the light emitting molecules and the layer of the metal complex using the metal complex having an energy gap of 2.8 eV or greater.

EXAMPLE 6

An organic EL device was prepared in accordance with the same procedures as those conducted in Example 1 except that compound (E2) was used in place of compound (E1) in the light emitting layer. The luminance of the emitted light, the efficiency of the light emission and the color of the emitted light under application of a direct current voltage of 6 V and the half-life of the light emission at the initial luminance of 500 cd/m² of this device are shown in Table 3.

EXAMPLE 7

An organic EL device was prepared in accordance with the same procedures as those conducted in Example 1 except that compound (E3) was used in place of compound (E1) in the light emitting layer. The luminance of the emitted light, the efficiency of the light emission and the color of the emitted light under application of a direct current voltage of 6 V and the half-life of the light emission at the initial luminance of 500 cd/m² of this device are shown in Table 3.

COMPARATIVE EXAMPLE 5

An organic EL device was prepared in accordance with the same procedures as those conducted in Example 1 except that 4,4'-bis[N-(1-naphthyl)-N-phenylamino]biphenyl

TABLE 3

| | Host material | Voltage (V) | Luminance of emitted light (nit) | Efficiency of light emission (cd/A) | Color of emitted light | Half-life (hour) |
|---|---|---|---|---|---|---|
| Example 6 | (E2) | 6 | 290 | 8.2 | blue | 3200 |
| Example 7 | (E3) | 6 | 215 | 7.5 | blue | 2800 |
| Comparative Example 5 | (C1) | 6 | 102 | 3.2 | greenish blue | 130 |

As shown in Table 3, in Examples 6 and 7, the electron injecting property was improved and the efficiency of the light emission increased. Moreover, the life increased due to suppressed injection of holes into the electron injecting layer. In contrast, in Comparative Example 5, the efficiency of the light emission was low. Moreover, holes were injected into the electron injecting layer since the light emitting molecules did not have the property to catch holes and the electron injecting layer emitted light. As the result, the emitted light was greenish and the life markedly decreased.

EXAMPLE 8

A glass substrate (manufactured by GEOMATEC Company) of 25 mm×75 mm×1.1 mm thickness having an ITO transparent electrode was cleaned by application of ultrasonic wave in isopropyl alcohol for 5 minutes and then by exposure to ozone generated by ultraviolet light for 30 minutes. The glass substrate having the transparent electrode lines which had been cleaned was attached to a substrate holder of a vacuum vapor deposition apparatus. On the surface of the cleaned substrate at the side having the transparent electrode, a film TPD232 having a thickness of 60 nm was formed in a manner such that the formed film covered the transparent electrode. The formed film of TPD232 worked as the hole injecting layer, After the formation of the film of TPD232, a film of N,N,N',N'-tetra(4-biphenyl)diaminobiphenylene (TBDB) having a thickness of 20 nm was formed on the formed film of TPD232. The formed film of TBDB worked as the hole transporting layer. On the film of TBDB formed above, a film of compound (E1) Having a thickness of 40 nm was formed. The formed film worked as the light emitting layer. On the film formed above, a film of the above metal complex (27) having a thickness of 20 nm was formed. The film of metal complex (27) worked as the electron injecting layer. The laminate of compound (E1) and metal complex (27) worked as the light emitting medium emitting blue light. Thereafter, Li (the source of lithium: manufactured by SAES GETTERS Company) as the reducing dopant and metal complex (27) were binary vapor deposited and a metal complex (27):Li film (the ratio of the amounts by mole: 1:1) was formed as the electron injecting layer (the cathode). On the formed film, metallic aluminum was vapor deposited to form a metal cathode and an organic EL device was prepared. When a direct current voltage of 5.5 V was applied to the organic EL device prepared above, blue light was emitted at a luminance of 200 cd/m² and an efficiency of the light emission of 7.5 cd/A. The device was driven by continuously passing a current constantly at an initial luminance of 500 cd/m² and the time before the luminance decreased to the half of the original value (the half-life) was found to be 2,000 hours.

EXAMPLE 9

An organic EL device was prepared in accordance with the same procedures as those conducted in Example 8 except that Cs metal was used in place of Li in the electron injecting layer. The luminance of the emitted light, the efficiency of the light emission and the color of the emitted light under application of a direct current voltage of 6 V and the half-life of the light emission at the initial luminance of 500 cd/m² of this device are shown in Table 4.

EXAMPLE 10

An organic EL device was prepared in accordance with the same procedures as those conducted in Example 8 except that an alkali fluoride CsF was used in place of Li in the electron injecting layer. The luminance of the emitted light, the efficiency of the light emission and the color of the emitted light under application of a direct current voltage of 6 V and the half-life of the light emission at the initial luminance of 500 cd/m² of this device are shown in Table 4.

EXAMPLE 11

An organic EL device was prepared in accordance with the same procedures as those conducted in Example 8 except that an alkali chalcogenide CsTe was used in place of Li in the electron injecting layer. The luminance of the emitted light, the efficiency of the light emission and the color of the emitted light under application of a direct current voltage of 6 V and the half-life of the light emission at the initial luminance of 500 cd/m² of this device are shown in Table 4.

COMPARATIVE EXAMPLE 6

An organic EL device was prepared in accordance with the same procedures as those conducted in Example 8 except that NPD was used in place of TBDB in the hole transporting layer. The luminance of the emitted light, the efficiency of the light emission and the color of the emitted light under application of a direct current voltage of 6 V and the half-life of the light emission at the initial luminance of 500 cd/m² of this device are shown in Table 4.

TABLE 4

|  | Hole transporting material | Voltage (V) | Luminance of emitted light (nit) | Efficiency of light emission (cd/A) | Color of emitted light | Half-life (hour) |
| --- | --- | --- | --- | --- | --- | --- |
| Example 8 | TBDB | 6 | 313 | 7.5 | blue | 2000 |
| Example 9 | TBDB | 6 | 560 | 9.2 | blue | 3200 |
| Example 10 | TBDB | 6 | 450 | 8.5 | blue | 2500 |
| Example 11 | TBDB | 6 | 620 | 9.0 | blue | 2000 |
| Comparative Example 6 | NPD | 6 | 120 | 6.0 | blue | 1300 |

As shown in Table 4, the organic EL devices of Examples 8 to 11 exhibited higher efficiencies of the light emission and had higher lives than those of the organic EL device of Comparative Example 6. The effect was exhibited due to an improved balance between the amounts of electrons and holes. The addition of the Cs metal or the Cs compound remarkably improved the properties and the voltage decreased. The addition of Cs compounds could be applied also to Examples 1 to 8.

INDUSTRIAL APPLICABILITY

As described in detail in the above, the organic EL device of the present invention exhibits a higher efficiency of light emission and has a longer life than conventional devices while the emitted light has a high luminance.

Therefore, the organic EL device of the present invention is very useful as the light source for various electronic instruments.

What is claimed is:

1. An organic electroluminescence device comprising a cathode, an anode and a layer of an organic thin film comprising one or a plurality of layers and disposed between the cathode and the anode, wherein (1) at least one of the layers in the layer of an organic thin film comprises a laminate of a layer comprising a metal complex having an energy gap of at least 2.8 eV and a layer of a host material and (2) the layer of the host material comprises light-emitting guest molecules that have an electron affinity smaller than an electron affinity of the host material and an ionization energy no greater than an ionization energy of the host material.

2. An organic electroluminescence device according to claim 1, wherein the layer of an organic thin film comprises a light emitting layer comprising a diarylanthracene derivative or a diarylbisanthracene derivative and a hole transporting layer adjacent to the light emitting layer comprises an N,N,N',N'-tetra(biphenyl)diaminoarylene derivative.

3. An organic electroluminescence device according to claim 2, wherein the diarylanthracene derivative is an arylbisanthracene derivative represented by the following general formula (2):

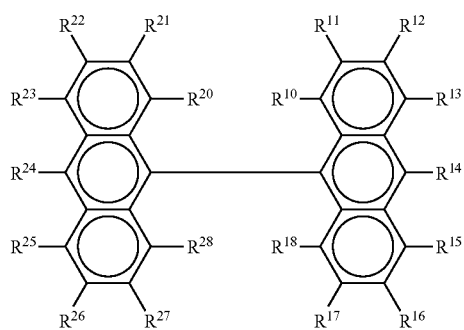

(2)

wherein $R^{10}$ to $R^{13}$, $R^{15}$ to $R^{18}$, $R^{20}$ to $R^{23}$ and $R^{25}$ to $R^{28}$ each independently represent hydrogen atom, a halogen atom, hydroxyl group, a substituted or unsubstituted amino group, nitro group, cyano group, a substituted or unsubstituted alkyl group having 1 to 30 carbon atoms, a substituted or unsubstituted alkenyl group having 2 to 30 carbon atoms, a substituted or unsubstituted cycloalkyl group having 5 to 30 carbon atoms, a substituted or unsubstituted alkoxyl group having 1 to 30 carbon atoms, a substituted or unsubstituted aromatic hydrocarbon group having 6 to 40 carbon atoms, a substituted or unsubstituted aromatic heterocyclic group having 2 to 40 carbon atoms, a substituted or unsubstituted aralkyl group having 7 to 40 carbon atoms, a substituted or unsubstituted aryloxyl group having 6 to 40 carbon atoms, a substituted or unsubstituted alkoxycarbonyl group having 2 to 30 carbon atoms or carboxyl group and $R^{14}$ and $R^{24}$ each independently represent a substituted or unsubstituted aryl group having 6 to 40 carbon atoms.

4. An organic electroluminescence device according to claim 1, wherein the host material is at least one compound selected from distyrylarylene erivatives, diarylanthracene derivatives and diarylbisanthracene derivatives.

5. An organic electroluminescence device according to claim 4, wherein the distyrylarylene derivative is a light emitting compound represented by the following general formula (1):

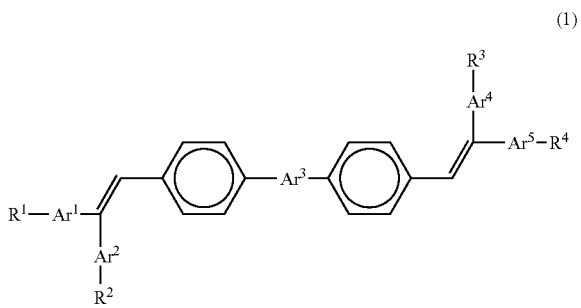

(1)

wherein $Ar^1$, $Ar^2$, $Ar^3$, $Ar^4$ and $Ar^5$ each independently represent a substituted or unsubstituted phenylene group, a substituted or unsubstituted naphthalene group, a substituted or unsubstituted anthracene group, a substituted or unsubstituted diphenylanthracene group, a substituted or unsubstituted phenanthrene group, a substituted or unsubstituted acenaphthene group, a substituted or unsubstituted biphenylene group, a substituted or unsubstituted fluorene group, a substituted or unsubstituted carbazole group, a substituted or unsubstituted thiophene group, a substituted or unsubstituted triazole group or a substituted or unsubstituted thiadiazole group; and $R^1$, $R^2$, $R^3$ and $R^4$ each independently represent hydrogen atom, an alkyl group having 1 to 30 carbon atoms, an alkoxyl group having 1 to 30 carbon atoms, an aryl group having 1 to 30 carbon atoms, a trialkylsilyl group having 1 to 30 carbon atoms or cyano group.

6. An organic electroluminescence device according to claim 4, wherein the diarylanthracene derivative is an arylbisanthracene derivative represented by the following general formula (2):

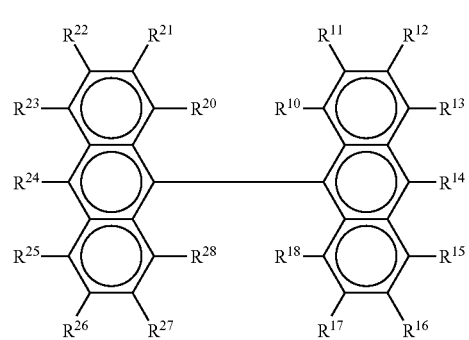

(2)

wherein $R^{10}$ to $R^{13}$, R15 to R18, $R^{20}$ to $R^{23}$ and $R^{25}$ to $R^{28}$ each independently represent hydrogen atom, a halogen atom, hydroxyl group, a substituted or unsubstituted amino group, nitro group, cyano group, a substituted or unsubstituted alkyl group having 1 to 30 carbon atoms, a substituted or unsubstituted alkenyl group having 2 to 30 carbon atoms, a substituted or unsubstituted cycloalkyl group having 5 to 30 carbon atoms, a substituted or unsubstituted alkoxyl group having 1 to 30 carbon atoms, a substituted or unsubstituted aromatic hydrocarbon group having 6 to 40 carbon atoms, a substituted or unsubstituted aromatic heterocyclic group having 2 to 40 carbon atoms, a substituted or unsubstituted aralkyl group having 7 to 40 carbon atoms, a substituted or unsubstituted aryloxyl group having 6 to 40 carbon atoms, a substituted or unsubstituted alkoxycarbonyl group having 2 to 30 carbon atoms or carboxyl group and $R^{14}$ and $R^{24}$ each independently represent a substituted or unsubstituted aryl group having 6 to 40 carbon atoms.

7. An organic electroluminescence device according to claim 1, wherein the metal complex is a metal complex having a ring having nitrogen as a ligand.

8. An organic electroluminescence device according to claim 1, which comprises a reducing dopant at an interface of the cathode and the layer of an organic thin film.

9. An organic electroluminescence device according to claim 1, wherein the metal complex is:
a metal complex represented by the following general formula (3):

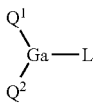

wherein $Q^1$ and $Q^2$ each independently represent a ligand represented by the following general formula (4):

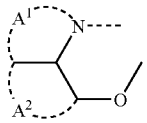

(in general formula (4), $A^1$ and $A^2$ each independently representing a substituted or unsubstituted six-membered aryl cyclic structure and the structures represented by $A^1$ and $A^2$ being condensed with each other), L represents a substituted or unsubstituted alkyl group having 1 to 30 carbon atoms, a substituted or unsubstituted cycloalkyl group having 5 to 30 carbon atoms, a substituted or unsubstituted aryl group having 6 to 40 carbon atoms, a substituted or unsubstituted heterocyclic group having 2 to 40 carbon atoms or a ligand represented by —OR, —OAr, —ORAr, —OC(O)R, —OC(O)Ar, —OP(O)R$_2$, —SeAr, —TeAr, —SAr, —X, —OP(O)Ar$^2$, OS(O$_2$)R, —OS(O$_2$)Ar, —OSiR$_3$, —OB(OR)$_2$, —OSiAr$_3$, —OArO—, —OC(O)ArC(O)O— (in the formulae, R representing a substituted or unsubstituted alkyl group having 1 to 30 carbon atoms or a substituted or unsubstituted cycloalkyl group having 5 to 30 carbon atoms, X representing a halogen atom, and Ar representing a substituted or unsubstituted aryl group having 6 to 36 carbon atoms or a substituted or unsubstituted heterocyclic group having 5 to 40 carbon atoms) or —O—Ga-Q$^3$(Q$^4$) (in the formula, Q$^3$ and Q$^4$ each independently representing a same ligand as that represented by $Q^1$ or $Q^2$); or a metal complex represented by the following general formula (5):

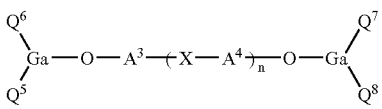

wherein $Q^5$ to $Q^8$ each independently represent a ligand represented by general formula (4); $A^3$ and $A^4$ represent a substituted or unsubstituted alkylene group having 1 to 30 carbon atoms, a substituted or unsubstituted divalent monocyclic group having 5 to 30 carbon atoms or a substituted or unsubstituted divalent condensed polycyclic group having 6 to 40 carbon atoms; X represents a substituted or unsubstituted alkylene group having 1 to 30 carbon atoms, O, S, SO$_2$, >C=O, >SiR$^{40}$R$^{41}$ or >NR$^{42}$; when $A^3$ and $A^4$ represent a substituted or unsubstituted alkylene group, X does not represent an alkylene group; n represents an integer of 0 to 2; $R^{40}$ to $R^{42}$ each independently represent hydrogen atom, a halogen atom, cyano group, nitro group, a substituted or unsubstituted alkyl group having 1 to 30 carbon atoms, a substituted or unsubstituted alkoxyl group having 1 to 30 carbon atoms, a substituted or unsubstituted aryloxyl group having 6 to 40 carbon atoms, a substituted or unsubstituted alkylthio group having 1 to 30 carbon atoms, a substituted or unsubstituted arylthio group having 6 to 40 carbon atoms, a substituted or unsubstituted monocyclic group having 5 to 40 carbon atoms, a substituted or unsubstituted condensed polycyclic group having 8 to 40 carbon atoms or a substituted or unsubstituted amino group; and adjacent groups represented by $R^{40}$ and $R^{41}$ may be bonded to each other to form a ring.

10. An organic electroluminescence device according to claim 9, wherein, in general formula (3), at least one of $Q^1$ and $Q^2$ represents a ligand represented by the following general formula (6):

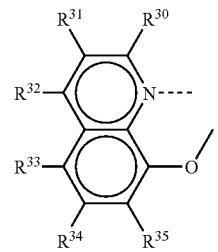

wherein $R^{30}$ to $R^{35}$ each independently represent hydrogen atom, a halogen atom, cyano group, nitro group, a substituted or unsubstituted alkyl group having 1 to 30 carbon atoms, a substituted or unsubstituted cycloalkyl group having 5 to 40 carbon atoms, a substituted or unsubstituted aryl group having 6 to 40 carbon atoms or a substituted or unsubstituted heterocyclic group having 2 to 40 carbon atoms.

11. An organic electroluminescence device according to claim 1, wherein the metal complex is a complex represented by the following general formula (7):

$$[((R^5)_m\text{-}Q')_{3-k}Al]_xL'_k \qquad (7)$$

wherein x represents 1 or 2 when k represents 1 and represents 1 when k represents 2; m represents a number of 1 to 6; L' represents a group represented by —R', —Ar', —OR', —OAr', —OR'Ar', —OC(O)R', —OC(O)Ar', —OP(O)R'$_2$, —SeAr', —TeAr', —SAr', —X', —OP(O)Ar'$_2$, —OS(O$_2$)R', —OS(O$_2$)Ar', —OSiR'$_3$, —OB(OR')$_2$, —OSiAr'$_3$, —OAr'O— or —OC(O)Ar'C(O)O— (in the formulae, R' representing a hydrocarbon group having 1 to 6 carbon atoms, X' representing a halogen atom, Ar' representing an aryl group having 6 to 36 carbon atoms and, when k and x represent 1, the ligand being not phenol); Q' represents a substituted 8-quinolinolato ligand; and $R^s$ represents a substituent to the 8-quinolinolato ring.

12. An organic electroluminescence device according to claim 1, wherein the light emitting guest molecule is an amine compound having a styryl group.

13. An organic electroluminescence device according to claim 1, wherein the light emitting guest molecule is a condensed aromatic amine compound.

14. An organic electroluminescence device according to claim 1, wherein the layer of an organic thin film comprising a laminate of a layer comprising a metal complex having an energy gap of at least 2.8 eV and a layer of a host material functions as a light emitting layer.

* * * * *

UNITED STATES PATENT AND TRADEMARK OFFICE
CERTIFICATE OF CORRECTION

PATENT NO. : 7,087,322 B2
APPLICATION NO. : 10/935102
DATED : August 8, 2006
INVENTOR(S) : Chishio Hosokawa et al.

It is certified that error appears in the above-identified patent and that said Letters Patent is hereby corrected as shown below:

Column 1, line 52, "200289" should read --200889--.

Column 4, lines 64 through 66, "arylanthracene derivatives expressed by formulae (1') to (5') and distyrylarylene derivatives expressed by formulae (6') to (9')" should read --distyrylarylene derivatives expressed by formulae (1') to (9')--.

Column 34, line 36, "(28)" should read --(16)--,
line 49, "(17)" should read --(28)--.

Column 43, in "TABLE 2", first and second columns, "Comparative Example 1 (C1)" should read --Comparative Example 1 (D3)--; "Comparative Example 2 (C2)" should read --Comparative Example 2 (D3)--, and "Comparative Example 3 (C3)" should read --Comparative Example 3 (D3)--.

Column 44, in "TABLE 3", first and second columns, "Comparative Example 5 (C1)" should read --Comparative Example 5 (NPD)--.

Signed and Sealed this

Fourth Day of November, 2008

JON W. DUDAS
*Director of the United States Patent and Trademark Office*